US009368432B2

(12) United States Patent
Shimizu et al.

(10) Patent No.: US 9,368,432 B2
(45) Date of Patent: Jun. 14, 2016

(54) SEMICONDUCTOR DEVICE AND MANUFACTURING METHOD OF SEMICONDUCTOR DEVICE

(71) Applicant: Renesas Electronics Corporation, Kawasaki-Shi (JP)

(72) Inventors: Akito Shimizu, Kawasaki (JP); Shirou Okada, Kawasaki (JP)

(73) Assignee: RENESAS ELECTRONICS CORPORATION, Kawasaki-shi, Kanagawa (JP)

( * ) Notice: Subject to any disclaimer, the term of this patent is extended or adjusted under 35 U.S.C. 154(b) by 0 days.

(21) Appl. No.: 14/280,414

(22) Filed: May 16, 2014

(65) Prior Publication Data

US 2014/0353809 A1 Dec. 4, 2014

(30) Foreign Application Priority Data

May 29, 2013 (JP) ................................. 2013-113337

(51) Int. Cl.
*H01L 23/49* (2006.01)
*H01L 23/495* (2006.01)
(Continued)

(52) U.S. Cl.
CPC ...... *H01L 23/49513* (2013.01); *H01L 21/4842* (2013.01); *H01L 23/49551* (2013.01); *H01L 23/49555* (2013.01); *H01L 23/49582* (2013.01); *H01L 24/97* (2013.01); *H01L 23/49541* (2013.01); *H01L 23/49548* (2013.01); *H01L 24/05* (2013.01); *H01L 24/29* (2013.01); *H01L 24/32* (2013.01); *H01L 24/45* (2013.01); *H01L 24/48* (2013.01); *H01L 24/49* (2013.01); *H01L 24/73* (2013.01); *H01L 2224/05554* (2013.01); *H01L 2224/05624* (2013.01); *H01L 2224/2929* (2013.01); *H01L 2224/29339* (2013.01); *H01L 2224/32245* (2013.01); *H01L 2224/32257* (2013.01); *H01L 2224/45144* (2013.01);
(Continued)

(58) Field of Classification Search
CPC ............ H01L 21/4821; H01L 21/4846; H01L 21/4853; H01L 23/495; H01L 23/4951; H01L 23/49517; H01L 23/4952; H01L 23/49537; H01L 23/49575; H01L 23/49582; H01L 23/49586; H01L 2225/1029
See application file for complete search history.

(56) References Cited

U.S. PATENT DOCUMENTS 6,329,706 B1 12/2001 Nam
6,831,352 B1 * 12/2004 Tsai ............................. 257/666
(Continued)

FOREIGN PATENT DOCUMENTS

JP 2001-85591 A 3/2001
JP 2002-134677 A 5/2002
JP 2008-211231 A 9/2008

*Primary Examiner* — Su C Kim
(74) *Attorney, Agent, or Firm* — McGinn IP Law Group PLLC

(57) ABSTRACT

A technique capable of enhancing a reliability of a semiconductor device is provided. A semiconductor device has a die pad on which a semiconductor chip is mounted. The die pad is sealed with resin so that a lower surface located on an opposite side of an upper surface on which the semiconductor chip is mounted is exposed. Also, the die pad has a central part including a region in which the semiconductor chip is mounted and a peripheral edge part provided next to the central part in a planar view. In addition, a step surface formed so that a height of the peripheral edge part becomes higher than a height of the central part is provided at a boundary between the central part and the peripheral edge part.

20 Claims, 25 Drawing Sheets

(51) Int. Cl.
*H01L 21/48* (2006.01)
*H01L 23/00* (2006.01)

(52) U.S. Cl.
CPC ................. *H01L2224/48091* (2013.01); *H01L 2224/48247* (2013.01); *H01L 2224/48257* (2013.01); *H01L 2224/48624* (2013.01); *H01L 2224/48639* (2013.01); *H01L 2224/48644* (2013.01); *H01L 2224/49109* (2013.01); *H01L 2224/49171* (2013.01); *H01L 2224/73265* (2013.01); *H01L 2224/83855* (2013.01); *H01L 2224/85439* (2013.01); *H01L 2224/85444* (2013.01); *H01L 2224/92247* (2013.01); *H01L 2924/15747* (2013.01); *H01L 2924/181* (2013.01)

(56) References Cited

U.S. PATENT DOCUMENTS

2002/0096790 A1 7/2002 Kasuya
2006/0175717 A1 8/2006 Kasuya

* cited by examiner

SEMICONDUCTOR DEVICE AND MANUFACTURING METHOD OF SEMICONDUCTOR DEVICE

CROSS-REFERENCE TO RELATED APPLICATIONS

The present application claims priority from Japanese Patent Application No. 2013-113337 filed on May 29, 2013, the content of which is hereby incorporated by reference to this application.

TECHNICAL FIELD

The present invention relates to a semiconductor device and a manufacturing technique thereof, and particularly relates to a technique effectively applied to a semiconductor device in which a semiconductor chip is mounted on a die pad.

BACKGROUND

Japanese Patent Application Laid-open Publication No. 2001-85591 (Patent Document 1) describes that a groove is formed in an upper surface of a die pad (chip pad) on which a semiconductor chip is mounted.

Also, Japanese Patent Application Laid-open Publication No. 2008-211231 (Patent Document 2) describes that a die pad is deformed by metal stamping so that a circular central part thereof on which a semiconductor chip is mounted protrudes relative to its surrounding part.

In addition, Japanese Patent Application Laid-open Publication No. 2002-134677 (Patent Document 3) describes a structure in which a thin portion obtained by removing a part of a lower surface by etching is provided in the vicinity of the peripheral edge of a die pad (island) on which a semiconductor chip is mounted and a slit is formed in the thin portion.

SUMMARY

As a package model of a semiconductor device, a semiconductor device of a so-called tab exposed type has been known, in which a die pad (tab) on which a semiconductor chip is mounted is exposed from a sealing body. In the semiconductor device of the tab exposed type, heat dissipation capability can be enhanced because an area of a heat dissipation path to the outside of the semiconductor device can be increased. In addition, the die pad can be used as a terminal by electrically connecting the die pad and the semiconductor chip.

In the semiconductor device like this, a plane area of the die pad is larger than a plane area of the semiconductor chip. However, when the plane area of the die pad increases, detachment between the sealing body which seals the semiconductor chip and the die pad is likely to occur, and the reduction in reliability of the semiconductor device becomes a problem.

Other objects and novel characteristics will be apparent from the description of the present specification and the accompanying drawings.

A semiconductor device according to an embodiment has a die pad on which a semiconductor chip is mounted. The above-mentioned die pad is sealed with resin so that a second surface located on an opposite side of a first surface on which the semiconductor chip is mounted is exposed. Also, the die pad has a first portion including a region in which the semiconductor chip is mounted and a second portion provided next to the first portion in a planar view. In addition, a step surface formed so that a height of the second portion becomes higher than a height of the first portion is provided at a boundary between the first portion and the second portion.

According to the above-mentioned embodiment, reliability of the semiconductor device can be enhanced.

DETAILED DESCRIPTION

Description Form, Basic Terms and Usage in this Application

In this application, the embodiment of the invention will be described in a plurality of sections or the like when required as a matter of convenience. However, these are not independent and separate from each other unless otherwise stated, and the one relates to the entire or a part of the other as a modified example, details, or a supplementary explanation thereof regardless of the order of descriptions. Also, the repetitive descriptions of the same parts will be omitted in principle. Furthermore, the components in the embodiment are not always indispensable unless otherwise stated or except the case where the components are theoretically limited to that number and the components are apparently indispensable from context.

In the same way, in the description of an embodiment or the like, when mentioning "X made of A" for a material, a composition or the like, those containing elements other than A are not excluded unless otherwise stated or except the case where it is particularly specified that A is the only element thereof from context. For example, as for a constituent, it means "X which contains A as a main constituent" or the like. For example, when mentioning "silicon member" or the like, it is needless to say that it is not limited to a pure silicon and includes SiGe (silicon germanium) alloy, a multi-component alloy containing silicon as a main constituent, and a member containing other additives or the like. In addition, when mentioning gold plating, a Cu layer, nickel plating or the like, it includes not only pure one but also members having gold, Cu, nickel or the like as a main constituent unless otherwise stated in particular.

Furthermore, when mentioning a specific value or quantity, it is not particularly limited unless otherwise stated or except the case where it is theoretically limited to the specific value or quantity in principle, and the value larger or smaller than the specified value is also applicable.

Also, the same or similar components are denoted by the same or similar reference symbols throughout the drawings for describing the embodiments, and the repetitive description thereof is omitted in principle.

In addition, in the accompanying drawings, hatching or the like may be omitted even in a cross section when the hatching makes the drawings less unclear or when distinction from a gap is clear. In association with this, even when an opening is closed planarly, an outline in a background may be omitted when it is clear from the description or the like. In addition, even in the case other than a cross section, hatching or dot-pattern may be given in order to specify that a part is not a gap or specify a boundary of a region.

Figure 1:
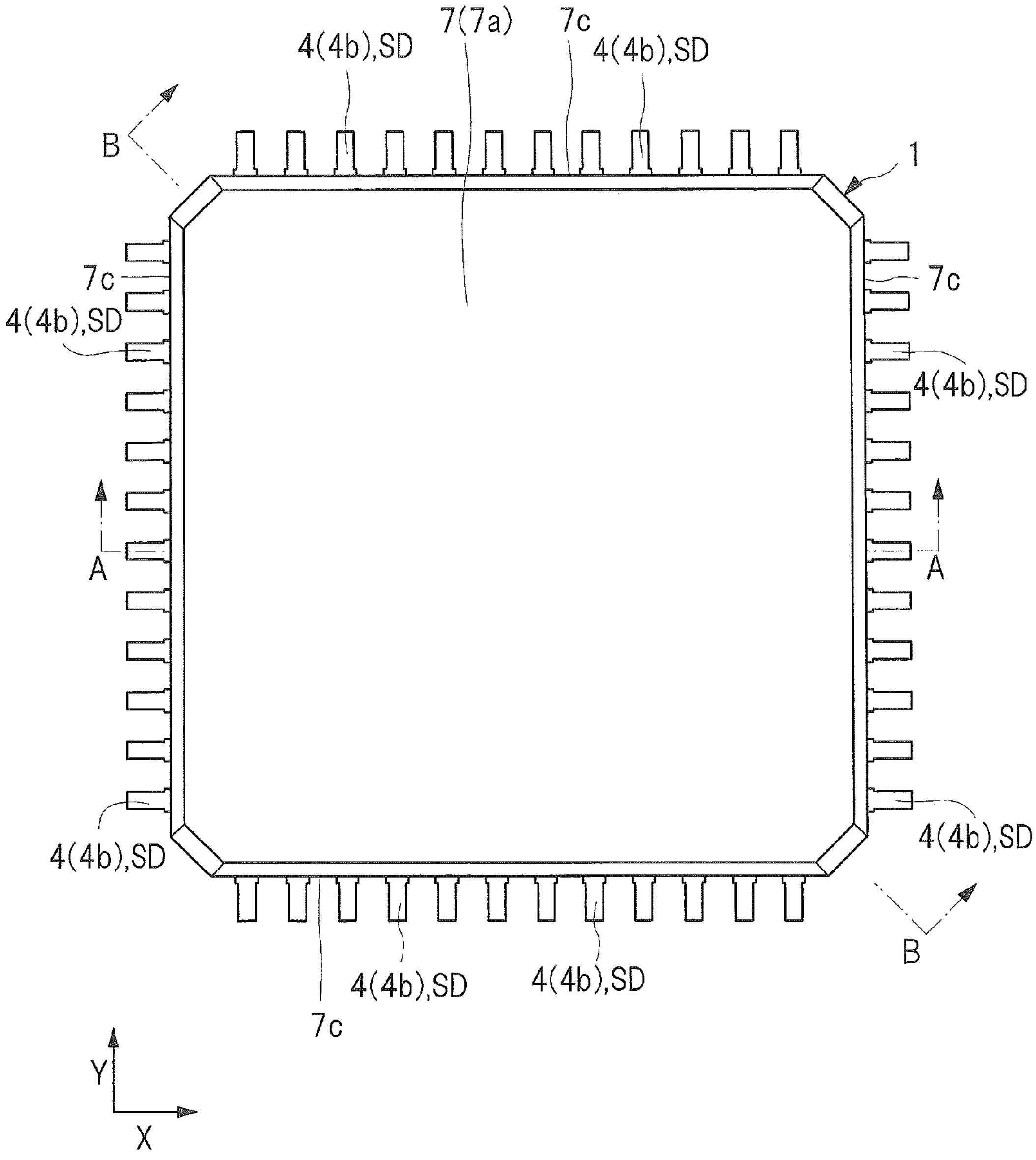
FIG. 1 is a top view of a semiconductor device in an embodiment.
Figure 2:
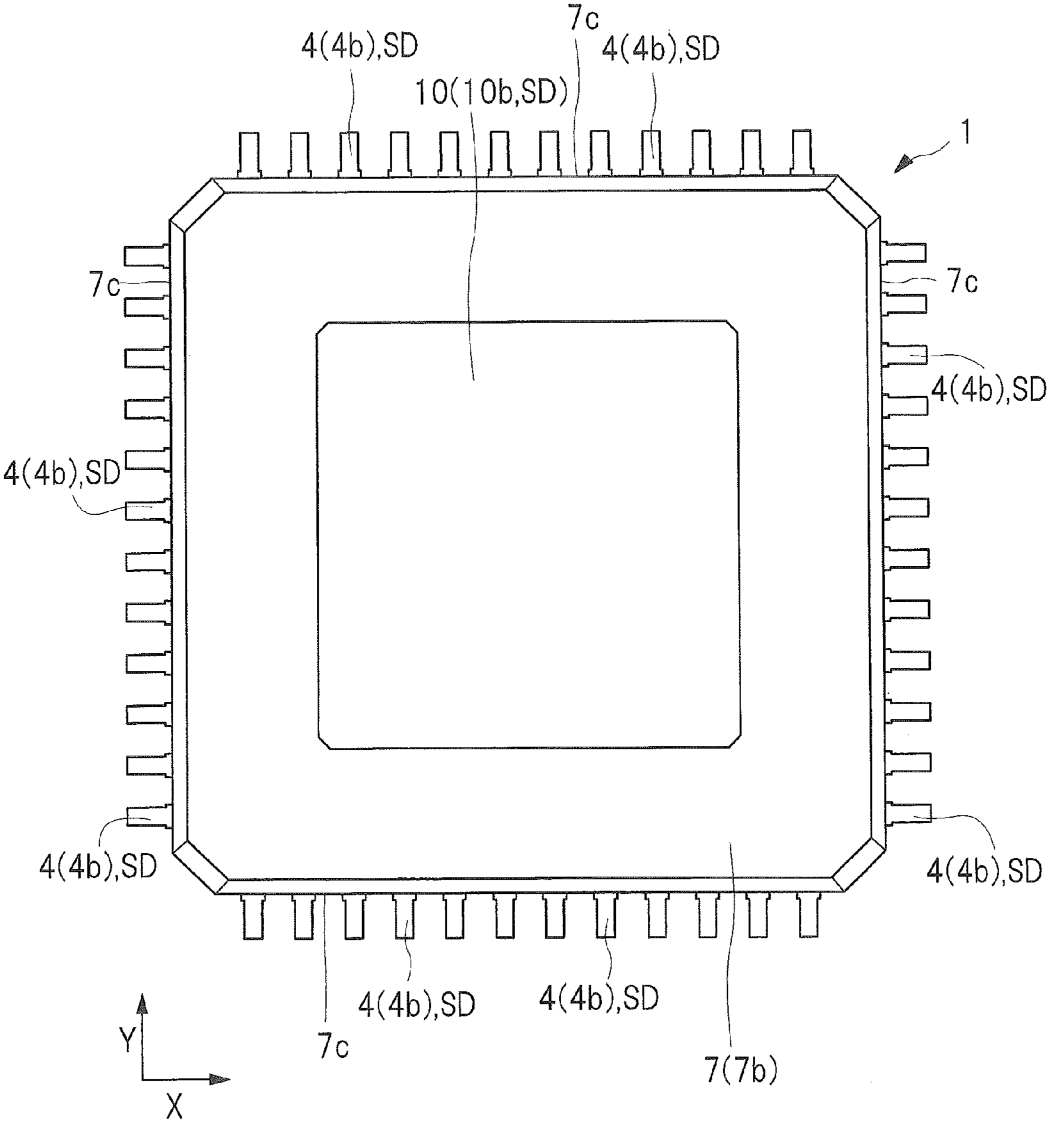
FIG. 2 is a bottom view of the semiconductor device shown in FIG. 1.
Figure 3:
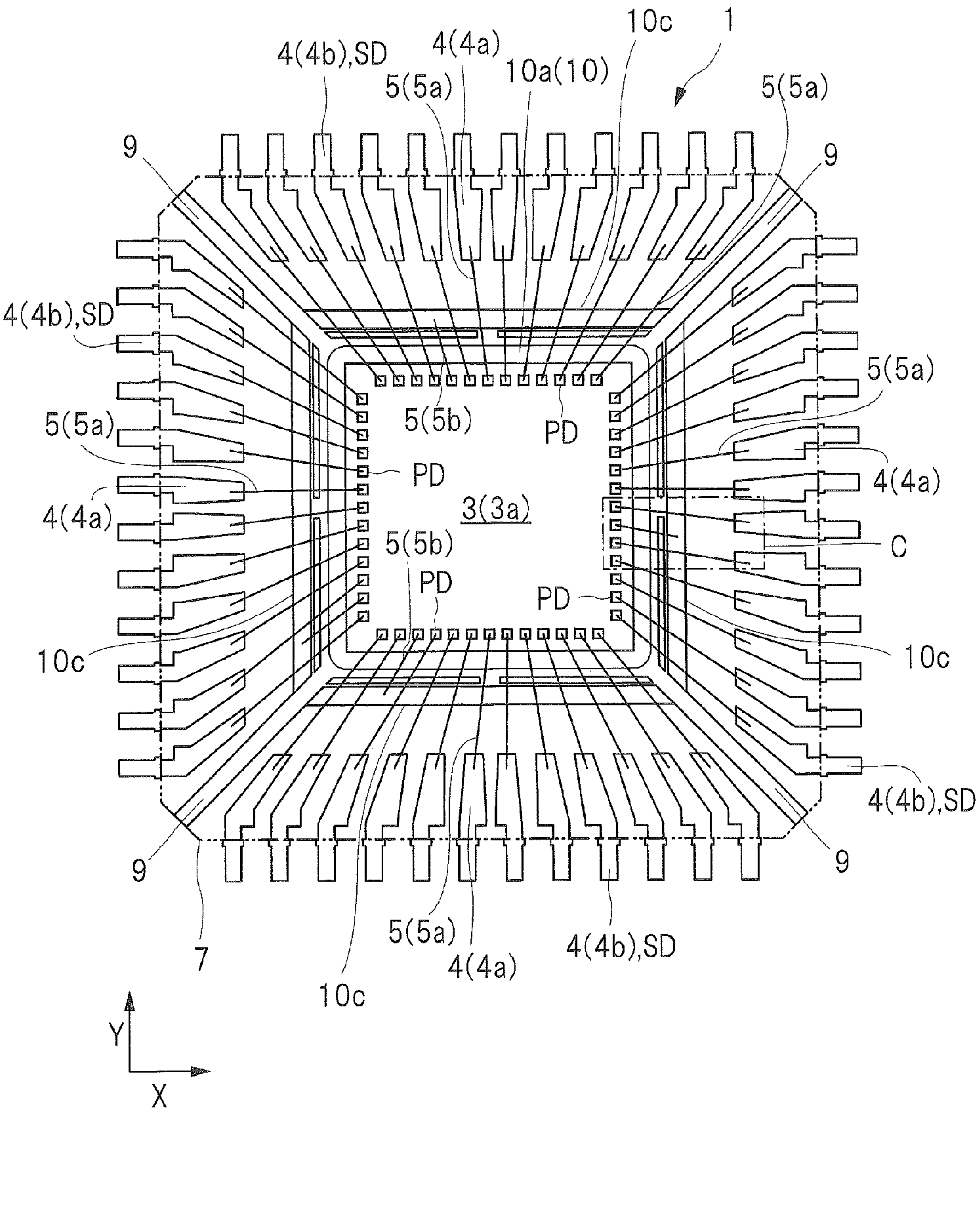
FIG. 3 is a transparent plan view showing an internal structure of the semiconductor device in a state where a sealing body shown in FIG. 1 is removed.
Figure 4:
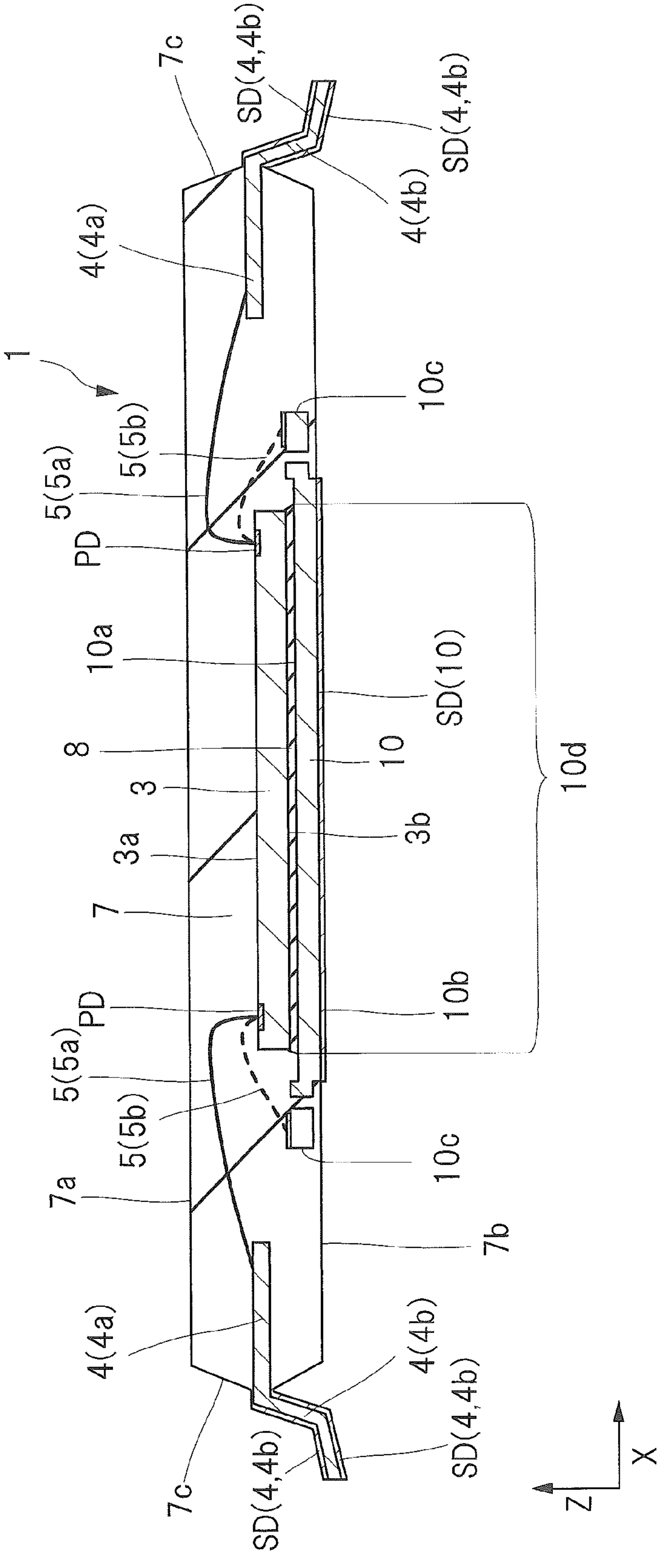
FIG. 4 is a sectional view taken along an A-A line of FIG. 1.
Figure 5:
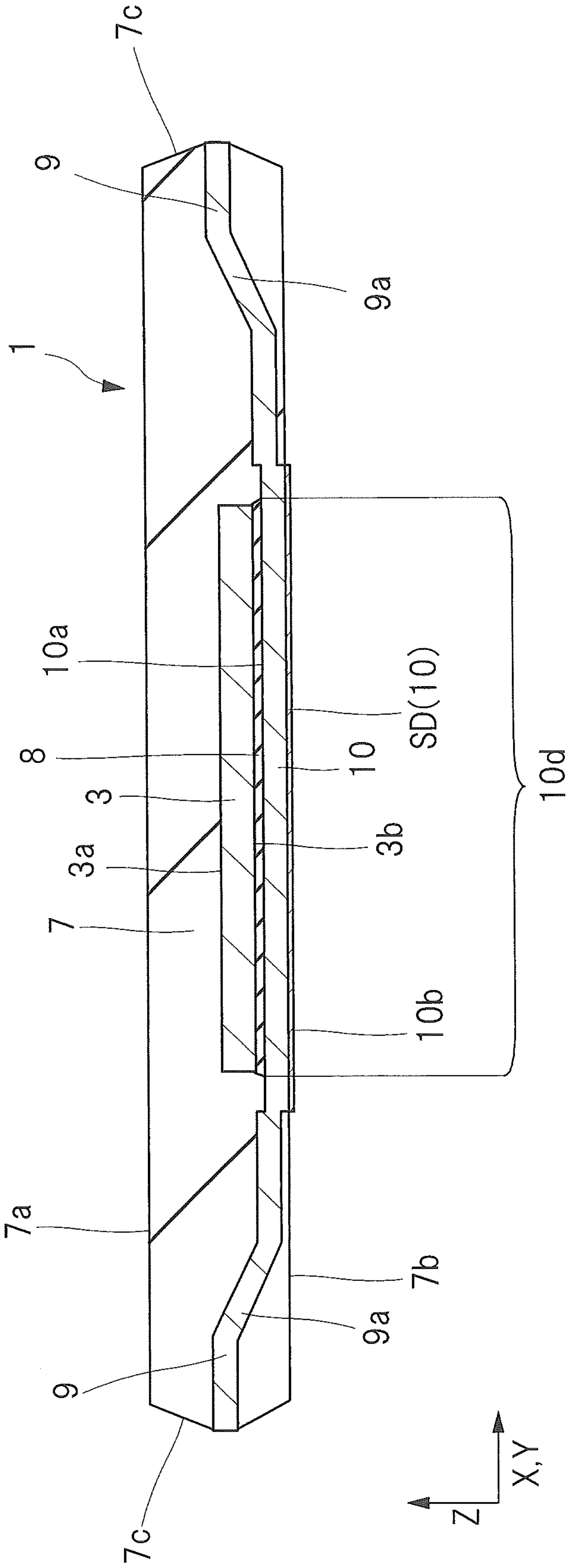
FIG. 5 is a sectional view taken along a B-B line of FIG. 1.

A technique described in the following embodiment is applicable to semiconductor devices of various package types which are manufactured by using a lead frame. In the present embodiment, the technique is applied to a QFP (Quad Flat Package) type semiconductor device in which a plurality of leads serving as external terminals are exposed on the side surface of a sealing body. FIG. 1 is a top view of the semiconductor device of the present embodiment and FIG. 2 is a bottom view of the semiconductor device shown in FIG. 1. Also, FIG. 3 is a transparent plan view showing an internal structure of the semiconductor device in a state where the sealing body shown in FIG. 1 is removed. In addition, FIG. 4 is a sectional view taken along an A-A line of FIG. 1 and FIG. 5 is a sectional view taken along a B-B line of FIG. 1.

<Semiconductor Device>

First, a summary of a configuration of a semiconductor device 1 of the present embodiment will be described with reference to FIGS. 1 to 5. The semiconductor device 1 of the present embodiment is provided with a die pad (chip mounting part, tab) 10 (see FIGS. 3 to 5) and a semiconductor chip 3 (see FIGS. 3 to 5) mounted via a die bonding material (adhesive material) 8 (see FIGS. 3 to 5) on the die pad 10. Also, the semiconductor device 1 has a plurality of leads (terminal, external terminal) 4 arranged next to (in the circumference of) the semiconductor chip 3 (die pad 10) and a plurality of wires (conductive member) 5 (see FIG. 3 and FIG. 4) which electrically connect a plurality of pads (electrode, bonding pad) PD (see FIG. 3 and FIG. 4) of the semiconductor chip 3 and a plurality of leads 4. Further, the semiconductor device 1 is provided with a sealing body (resin body) 7 which seals the semiconductor chip 3 and the plurality of wires 5. Also, a plurality of suspension leads 9 are connected to the die pad 10

<External Appearance Structure>

First, an external appearance structure of the semiconductor device 1 will be described. The planar shape of the sealing body (resin body) 7 shown in FIG. 1 is a square. In detail, each corner part is chamfered, which prevents the edges of the sealing body 7 from chipping. The sealing body 7 has an upper surface 7*a*, a lower surface (rear surface, mounting surface) 7*b* (see FIG. 2) opposite to this upper surface 7*a*, and side surfaces 7*c* located between the upper surface 7*a* and the lower surface 7*b*. The side surface 7*c* forms an inclined surface as shown in FIG. 4. The corner part of the sealing body 7 includes a peripheral area of a corner which is an intersection point of two intersecting sides (two main sides) among the four sides (four main sides) of the sealing body 7. Note that, strictly, since the corner part of the sealing body 7 is partly chamfered as shown in FIG. 1, the intersection point of the main sides is arranged outside the corner part of the sealing body 7. However, since the chamfered part is small enough as compared with the length of the main side, the center of the chamfered part is regarded as the corner of the sealing body 7 in the description of this application. In other words, in this application, in a region where two sides (two main sides) among four sides (four main sides) of the sealing body 7 intersect, when the chamfering has been carried out in the region, the chamfered part corresponds to the corner part, and when the chamfering has not been carried out in the region, an intersection point of two sides (two main sides) corresponds to the corner part. Hereinafter, when mentioning the corner part of the sealing body 7 in this application, it is used in the same meaning and contents as those described above, except the case where it is particularly specified that it is used to indicate different meaning and contents.

Also, as shown in FIGS. 1 and 2, in the semiconductor device 1, a plurality of leads 4 are arranged along each side (each main side) of the sealing body 7. The plurality of leads 4 are made of a metal material, and in the present embodiment, are made of, for example, a metal containing copper (Cu) as a main constituent. In addition, in the example shown in FIGS. 1 and 2, each of the plurality of leads 4 has a part (outer lead part 4*b*) projecting to the outside from the side surface 7*c* of the sealing body 7, and is formed into a gull wing shape on the outer side of the sealing body 7. In other words, the outer lead parts 4*b* of the plurality of leads 4 are each provided with a plurality of bent parts, and an end part of the outer lead part 4*b* is arranged at a position lower than the lower surface 7*b* of the sealing body 7. Further, on an exposed part (outer lead part 4*b*) of the lead 4 from the sealing body 7, a metal film SD is formed, which covers a lower surface of the above-mentioned base material. The metal film SD is made from, for example, a solder film (exterior plating film) formed by plating and functions as a bonding material when the lead 4 is bonded to a terminal of a mounting board (not shown).

The metal film SD of the present embodiment is made of so-called lead free solder which substantially contains no lead (Pb), and for example, is made of tin (Sn) only, tin-bismuth (Sn—Bi), tin-copper-silver (Sn—Cu—Ag) or the like. Here, the lead free solder means the solder whose lead (Pb) content is 0.1 wt % or less, and this content has been determined as a standard of RoHS (Restriction of Hazardous Substances) directive.

In addition, as shown in FIG. 2, a lower surface 10*b* of the die pad (chip mounting part, tab) 10 is exposed from the sealing body 7 on the lower surface 7*b* of the sealing body 7. More specifically, the semiconductor device 1 is a semiconductor device of a die pad exposed type (tab exposed type).

The die pad 10 is made of a metal material whose thermal conductivity is higher than that of the sealing body 7, and is composed of a copper (Cu) film or a laminated metal film obtained by forming a metal film (not shown) made of, for example, nickel (Ni) on a surface of a base material made of copper (Cu) in the present embodiment. In this way, in the semiconductor device of the die pad exposed type, since a metal member (die pad 10) such as copper (Cu) whose thermal conductivity is higher than that of the sealing body 7 is exposed, heat dissipation capability of the package can be enhanced as compared with a semiconductor device in which the die pad 10 is not exposed. In addition, when the semiconductor device 1 is mounted on the mounting board (not shown), if the lower surface 10*b* of the die pad 10 is connected to a terminal of the mounting board via, for example, the solder material (bonding material), the heat generated in the semiconductor device 1 can be dissipated to the mounting board more efficiently.

Also, as shown in FIGS. 3 and 4, in the present embodiment, the semiconductor chip 3 is electrically connected to the die pad 10, and the die pad 10 is used as an external terminal. In this way, by exposing the lower surface 10*b* of the die pad 10 to electrically connect it to the mounting board (not shown), a space for arranging the terminals of the semiconductor device 1 can be effectively utilized. In addition, a reference potential (for example, ground potential) is supplied to the die pad 10. From a viewpoint of enhancing electrical characteristics of the semiconductor device 1, the terminal to supply the reference potential is preferably designed to have a large area for the transmission path. More specifically, as shown in FIGS. 3 and 4, by using the die pad 10 as an external terminal to supply the reference potential, an area for the transmission path can be enlarged, and electrical characteristics of semiconductor device 1 can be enhanced.

Also, in the example shown in FIG. 2, the metal film SD which functions as the bonding material at the time of mounting is formed on the lower surface 10*b* of the die pad 10, and it covers the lower surface of the above-mentioned base material. The metal film SD is a solder film formed by plating as described above. In this way, by forming the metal film SD on the exposed surface of the die pad 10, it is possible to easily connect the die pad 10 to the terminal of the mounting board (not shown).

<Internal Structure>

Next, an internal structure of the semiconductor device 1 will be described. As shown in the plan view of FIG. 3, the upper surface (chip mounting surface) 10*a* of the die pad 10 has a rectangular (quadrangular) shape. In addition, in the present embodiment, an outline size (planar size) of the die pad 10 is larger than an outline size of the semiconductor chip 3 (planar size of the rear surface 3*b* shown in FIG. 4). In this way, by mounting the semiconductor chip 3 on the die pad 10 having a larger area than the outline size of the semiconductor chip 3 and exposing the lower surface 10*b* of the die pad 10 from the sealing body 7 as shown in FIG. 2, the heat dissipation capability can be enhanced. The other detailed structure of the die pad 10 will be described later.

Also, a plurality of leads 4 are arranged in the circumference of the die pad 10 (circumference of the semiconductor chip 3) as shown in FIG. 3. As shown in FIG. 4, each of the plurality of leads 4 is provided with an inner lead part 4*a* sealed inside the sealing body 7 and an outer lead part 4*b* exposed from the sealing body 7. In addition, the metal film SD is formed on the surface (upper surface, lower surface and side surface) of the outer lead part 4*b*. Further, a wire bonding part to which the wire 5 is bonded is included in the inner lead part 4*a*.

As shown in FIG. 3, a plurality of suspension leads 9 are connected (coupled) to the die pad 10. One end part of each of the plurality of suspension leads 9 is connected to a corner part (corner) of the die pad 10 forming a rectangle in a planar view. Also, the other end part of each of the plurality of suspension leads 9 extends toward a corner part of the sealing body 7 and is exposed from the sealing body 7 at the corner part.

Incidentally, as shown in FIG. 4, the die pad 10 is arranged at a different height from that of the inner lead part 4*a* (offset arrangement). More specifically, the die pad 10 is arranged at a position lower than the inner lead part 4*a* (down-set arrangement). In a package in which the lead 4 is formed into a gull wing shape like the present embodiment, the lead 4 preferably projects from a position corresponding to the middle position between the upper surface 7*a* and the lower surface 7*b* in the side surface 7*c* of the sealing body 7. This is for the purpose of firmly fixing the inner lead part 4*a* by the sealing body 7. On the other hand, in order to expose the die pad 10 from the sealing body 7, the die pad 10 needs to be arranged at a different height from that of the inner lead part 4*a*. Therefore, in the present embodiment, the die pad 10 is offset-arranged (down-set arrangement).

As a method for the offset arrangement mentioned above, an inclined part 9*a* (see FIG. 5) is formed in each of the plurality of suspension leads 9 which support the die pad 10 in the present embodiment. In this way, the die pad 10 can be offset-arranged (down-set arrangement).

Also, the semiconductor chip 3 is mounted on the die pad 10 as shown in FIG. 3. The semiconductor chip 3 is mounted on a chip mounting region 10*d* (see FIG. 4 and FIG. 5) located at the center of the die pad 10. As shown in FIG. 4, the semiconductor chip 3 is mounted on the die pad 10 via the die bonding material (adhesive material) 8 in a state where the rear surface 3*b* is opposed to the upper surface 10*a* of the die pad 10. More specifically, the semiconductor chip 3 is mounted by a so-called face-up mounting method in which an opposite surface (rear surface 3*b*) to a front surface (main surface) 3*a* on which a plurality of pads PD are formed is made to be opposed to a chip mounting surface (upper surface 10*a*). This die bonding material 8 is an adhesive material used at the time of the die bonding of the semiconductor chip 3, and an epoxy-based adhesive material or a conductive adhesive material obtained by mixing metal particles made of silver (Ag) or the like with an epoxy-based thermosetting resin is used as the die bonding material 8.

As shown in FIG. 3, a planar shape of the semiconductor chip 3 mounted on the die pad 10 is a rectangular shape. In the present embodiment, for example, it is a square shape. In addition, as shown in FIG. 4, the semiconductor chip 3 has the front surface (main surface, upper surface) 3*a*, the rear surface (main surface, lower surface) 3*b* opposite to the front surface 3*a*, and the side surfaces located between the front surface 3*a* and the rear surface 3*b*. Then, as shown in FIGS. 3 and 4, a plurality of pads (bonding pad) PD are formed on the front surface 3*a* of the semiconductor chip 3, and in the present embodiment, the plurality of pads PD are formed along each side of the front surface 3*a*. Further, though not shown, a plurality of semiconductor elements (circuit elements) are formed on the main surface of the semiconductor chip 3 (that is, semiconductor element formation region provided on an upper surface of a base material (semiconductor substrate) of the semiconductor chip 3). Furthermore, the plurality of pads PD are electrically connected to the semiconductor elements via wirings (not shown) formed in a wiring layer disposed inside the semiconductor chip 3 (that is, between the front surface 3*a* and the semiconductor element formation region (not shown)).

The semiconductor chip 3 (that is, semiconductor substrate of the semiconductor chip 3) is made of, for example, silicon (Si). In addition, an insulation film which covers the base material and wirings of the semiconductor chip 3 is formed on the front surface 3*a*, and a surface of each of the plurality of pads PD is exposed from the insulation film through an opening part formed in this insulation film. Further, this pad PD is made of metal, and is made of, for example, aluminum (Al) in the present embodiment. Note that an alloy layer containing aluminum (Al) as a main constituent may be employed for the pad PD.

Also, as shown in FIG. 3, a plurality of leads 4 made of, for example, the same copper (Cu) as the die pad 10 are arranged in the circumference of the semiconductor chip 3 (that is, circumference of the die pad 10). Then, the plurality of pads (bonding pad) PD formed on the front surface 3*a* of the semiconductor chip 3 are each electrically connected to the plurality of leads 4 via a plurality of wires (conductive member) 5. The wire 5 is made of, for example, gold (Au) and a part of the wire 5 (for example, one end part) is bonded to the pad PD, and the other part (for example, the other end part) is bonded to a bonding region of the lead 4. Though not shown, a plating film made of, for example, silver (Ag) or gold (Au) is preferably formed on the surface of the bonding region of the lead 4. By forming the plating film made of silver (Ag) or gold (Au) on the surface of the bonding region (wire bonding region) of the lead 4 (inner lead part 4*a*), bonding strength with the wire 5 which is made of gold (Au) can be enhanced.

In the present embodiment, some of the plurality of pads PD are electrically connected to the wire bonding region of the die pad 10 via wires (conductive member) 5*b*. In other words, the plurality of wires 5 connected to the plurality of pads PD of the semiconductor chip 3 include a plurality of wires 5*a* which electrically connect the plurality of pads PD to the plurality of leads 4 and wires 5*b* which electrically connect the pads PD to the die pad 10. By electrically connecting the pads PD of the semiconductor chip 3 to the die pad 10 via the wires 5*b* in this manner, the die pad 10 can be utilized as an external terminal. For example, as described above, a reference potential (for example, ground potential) is supplied to the die pad 10, and the reference potential is supplied to the semiconductor chip 3 via the die pad 10 and the wire 5*b*.

<Detailed Structure of Die Pad>

Figure 6:
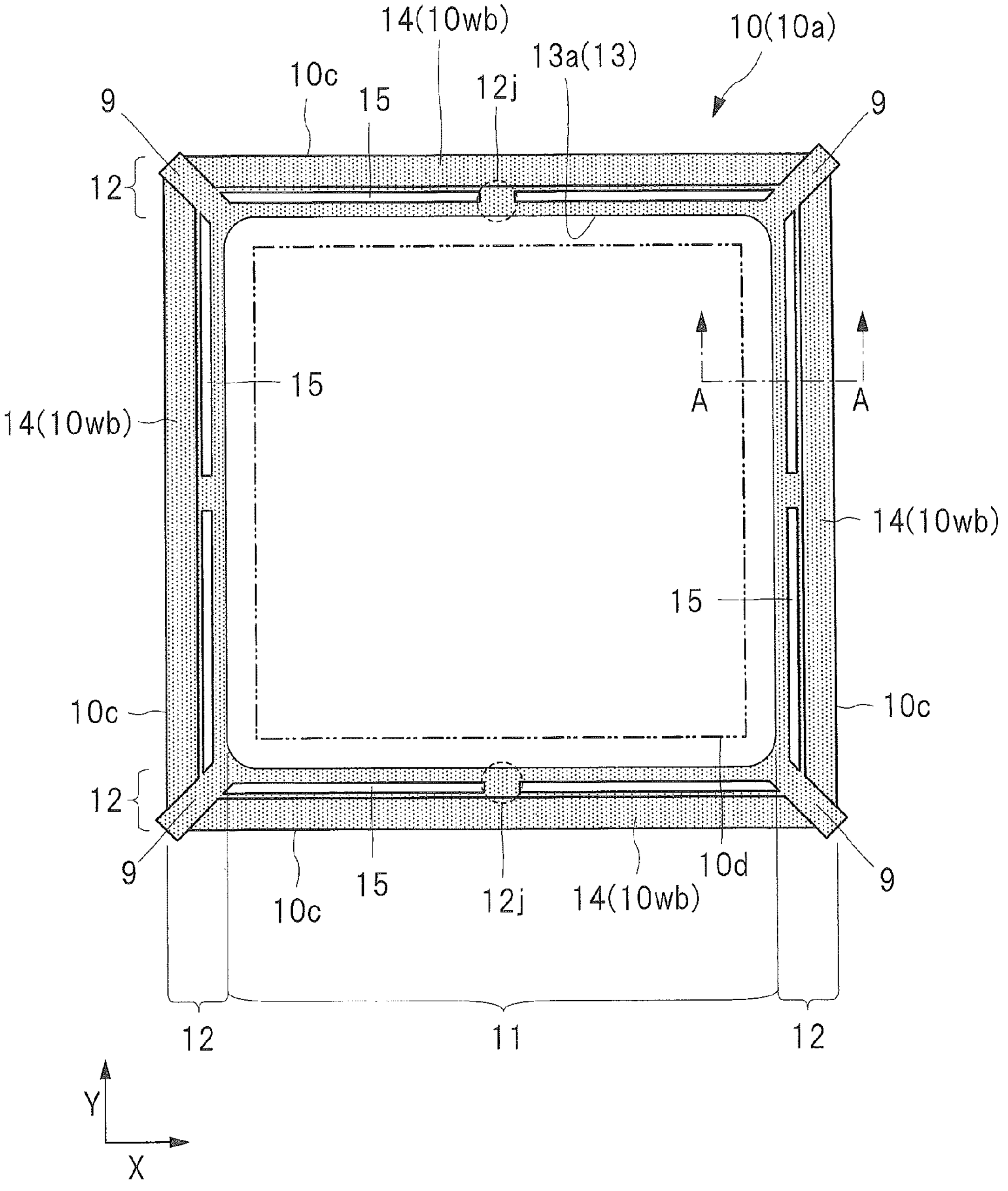
FIG. 6 is an enlarged plan view showing a die pad in FIG. 3 in an enlarged manner.
Figure 7:
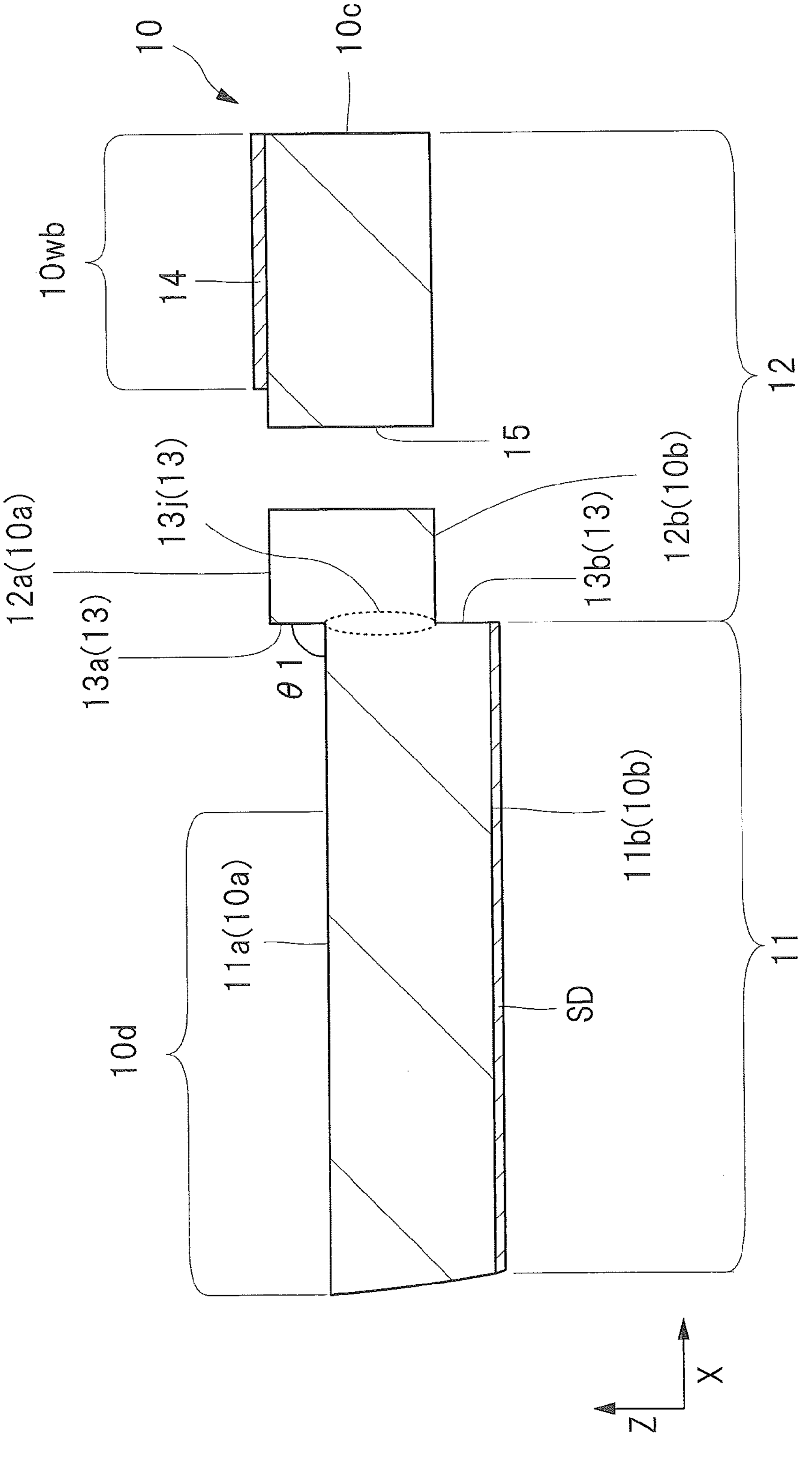
FIG. 7 is an enlarged sectional view taken along an A-A line of FIG. 6.
Figure 8:
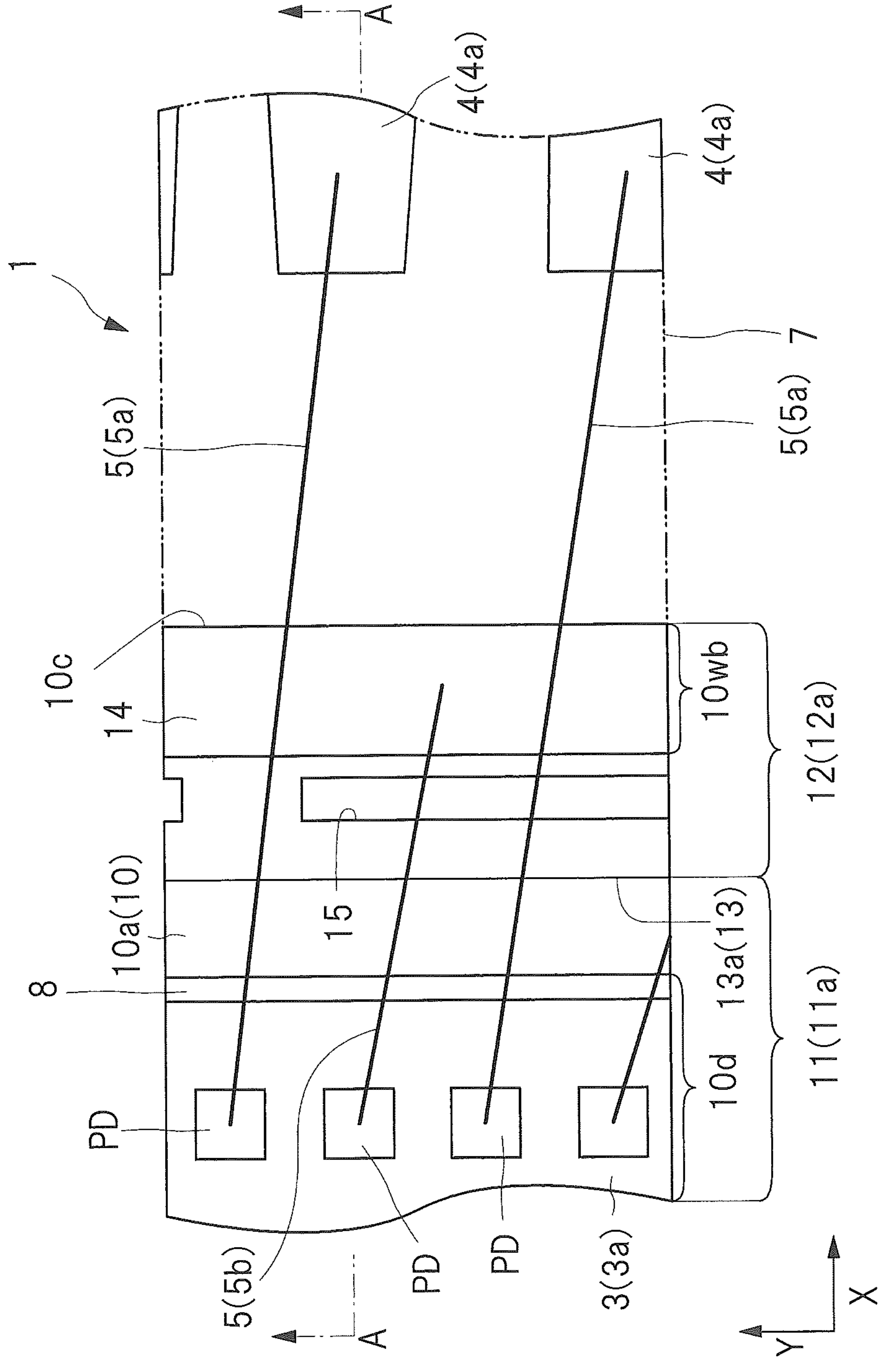
FIG. 8 is an enlarged plan view of a section C of FIG. 3.
Figure 9:
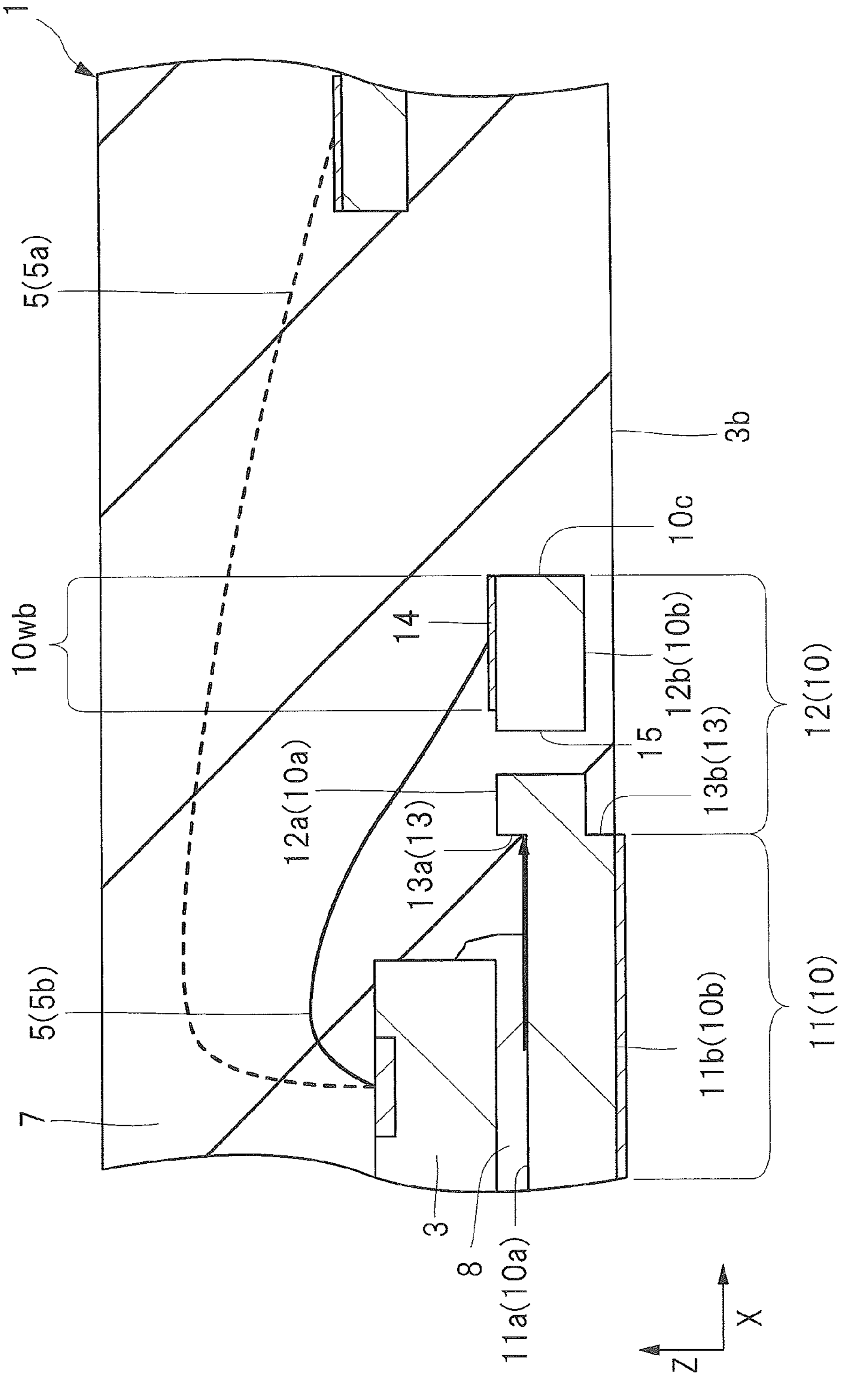
FIG. 9 is an enlarged sectional view taken along an A-A line of FIG. 8.

Next, the detailed structure of the die pad 10 shown in FIGS. 2 to 4 and an effect acquired from the structure will be described. FIG. 6 is an enlarged plan view showing the die pad in FIG. 3 in an enlarged manner, FIG. 7 is an enlarged sectional view taken along an A-A line of FIG. 6, FIG. 8 is an enlarged plan view of a section C of FIG. 3, and FIG. 9 is an enlarged sectional view taken along an A-A line of FIG. 8. Note that, in FIG. 6, in order to clearly illustrate a boundary between a central part 11 and a peripheral edge part 12, a dot-pattern is given to the peripheral edge part 12. Also, in FIG. 9, in order to clearly indicate that some of the wires 5 (wire 5*a*) are connected to the leads 4 and the others of the wires 5 (wire 5*b*) are connected to the die pad 10, the wire 5*a* is illustrated with a dotted line and the wire 5*b* is illustrated with a solid line.

In the semiconductor device 1 of the present embodiment, as described with reference to FIGS. 1 to 5, a plane area of the die pad 10 is larger than a plane area of rear surface 3*b* of the semiconductor chip 3. Also, the lower surface 10*b* of the die pad 10 which has an area larger than a plane area of the semiconductor chip 3 is exposed from the sealing body 7 as shown in FIG. 4. However, when the plane area of the die pad 10 increases, detachment of the die pad 10 from the sealing body 7 which seals the semiconductor chip 3 is likely to occur, and the reduction in reliability of the semiconductor device 1 becomes a problem. For example, since the semiconductor chip 3 and the die pad 10 differ in a linear expansion coefficient, when a temperature cycle is applied, the detachment is likely to occur at an adhesive interface between the semiconductor chip 3 and the die pad 10. More specifically, at the adhesive interface between the die bonding material 8 which adheres and fixes the semiconductor chip 3 and the die pad 10, a stress caused by a temperature cycle load is generated and the detachment occurs due to the stress. Since the stress caused by the temperature cycle load increases in proportion to the plane area of the die pad 10, the detachment is more likely to occur when the plane area of the die pad 10 increases.

Then, when the detachment occurs at the adhesive interface between the die pad 10 and the die bonding material 8 and a temperature cycle load is then applied, the detachment develops toward the peripheral edge part (side surface 10*c*) of the die pad 10 (along the upper surface 10*a* of the die pad 10) from the detachment occurrence point. In addition, although the sealing body 7 and the upper surface 10*a* of the die pad 10 adhere to each other between the chip mounting region 10*d* of the die pad 10 and the side surface 10*c*, the adhesive strength between the die pad 10 and the sealing body 7 is nearly equal to or less than the adhesive strength between the die pad 10 and the die bonding material 8. Therefore, the above-mentioned detachment develops up to the contact interface between the die pad 10 and the sealing body 7.

Since deterioration of the adhesiveness between the die pad 10 and the sealing body 7 will become a cause of the dropout or the like of the die pad 10 from the sealing body 7, it is preferred to prevent or suppress the development of the detachment from a viewpoint of suppressing the reduction in reliability of the semiconductor device 1. In particular, when the wire 5*b* is bonded to a part of the die pad 10 like the present embodiment, if the detachment develops up to a bonding part between the wire 5*b* and the die pad 10, it will become a cause of disconnection of the wire 5*b*. Therefore, it is preferred to prevent or suppress the development of the detachment from a viewpoint of enhancing the electric reliability of the semiconductor device 1.

Here, the die pad 10 of the semiconductor device 1 of the present embodiment has the central part 11 including the chip mounting region 10*d* and the peripheral edge part 12 provided so as to surround the central part 11 in a planar view as shown in FIG. 6. Also, as shown in FIG. 7, at the boundary between the central part 11 and the peripheral edge part 12, step surfaces 13*a* and 13*b* are provided so that a height of the peripheral edge part 12 becomes higher than a height of the central part 11.

In other words, as shown in FIG. 7, the central part 11 of the die pad 10 has the upper surface 11*a* which is the chip mounting surface and the lower surface 11*b* which is located on an opposite side of the upper surface 11*a*. In addition, the peripheral edge part 12 provided on the outer side of the central part 11 (side surface 10*c* side) has an upper surface 12*a* facing in the same direction (Z direction in the example shown in FIG. 7) as the upper surface 11*a* of the central part 11 and a lower surface 12*b* which is located on an opposite side of the upper surface 12*a*. Also, the step section 13 is formed at the boundary between the central part 11 and the peripheral edge part 12, and the upper surface 12*a* of the peripheral edge part 12 is located at a position higher than the upper surface 11*a* of the central part 11. In addition, the lower surface 12*b* of the peripheral edge part 12 is located at a position higher than the lower surface 11*b* of the central part 11.

Furthermore, between the upper surface 12*a* of the peripheral edge part 12 and the upper surface 11*a* of the central part 11 of the die pad 10, the step surface 13*a* is formed along a thickness direction (Z direction in FIG. 7) perpendicular to the upper surface 11*a* and the upper surface 12*a*. The step surface 13*a* is continuous with the upper surface 12*a* of the peripheral edge part 12 and the upper surface 11*a* of the central part 11. Also, between the lower surface 12*b* of the peripheral edge part 12 and the lower surface 11*b* of the central part 11 of the die pad 10, the step surface 13*b* is formed along the thickness direction (Z direction in FIG. 7) perpendicular to the lower surface 11*b* and the lower surface 12*b*. The step surface 13*b* is continuous with the lower surface 12*b* of the peripheral edge part 12 and the lower surface 11*b* of the central part 11.

Although details will be described later, the step section 13 is formed by a processing method to perform metal stamping (hereinafter, described as dislocation process) in a state where the central part 11 and peripheral edge part 12 of the die pad 10 are held by a jig (shearing jig) (not shown). Each of the step surfaces 13*a* and 13*b* of the step section 13 formed by the dislocation process in this way is a shear surface sheared by the jig.

In addition, in the peripheral edge part 12 of the die pad 10 of the semiconductor device 1 of the present embodiment, a wire connection region 10*wb* which is a region to electrically connect the wire 5*b* is provided (see FIG. 8 and FIG. 9). In other words, in the semiconductor device 1 of the present embodiment, the step section 13 having the step surface 13*a* is arranged between the wire connection region 10*wb* and the chip mounting region 10*d* provided on the upper surface 10*a* side of the die pad 10.

Here, a tendency of the development of the detachment when the detachment occurs at the adhesive interface between the die pad 10 and the die bonding material 8 in the semiconductor device 1 (see FIG. 8) of the present embodiment will be described. As schematically shown with an arrow in FIG. 9, when the detachment occurs at the adhesive interface between the die pad 10 and the die bonding material 8, the detachment develops toward the peripheral edge part 12 from the central part 11 along the upper surface 10*a* of the die pad 10. Also, when the detachment reaches the contact interface between the sealing body 7 and the upper surface 10*a* of the die pad 10, the detachment between the sealing body 7 and the die pad 10 develops.

At this time, the detachment at the contact interface between the sealing body 7 and the die pad 10 develops planarly toward the peripheral edge part 12 along the upper surface 11*a* of the central part 11. Therefore, when the step surface 13*a* (step section 13) is provided between the wire connection region 10*wb* and the chip mounting region 10*d* (see FIG. 7) like the present embodiment, the development of the detachment can be easily stopped at the boundary between the step surface 13*a* and the upper surface 11*a*.

In addition, as shown in FIG. 6, the step surface 13*a* of the present embodiment is provided so as to continuously surround the circumference of the chip mounting region 10*d*, that is, the circumference of the semiconductor chip 3 shown in FIG. 3. Therefore, even when the detachment at the contact interface between the sealing body land the die pad 10 shown in FIG. 9 develops toward all directions in a planar view, for example, the step surface 13*a* always exists between the wire connection region 10*wb* and the chip mounting region 10*d*. Therefore, it is possible to prevent the detachment from coming around to a part in which the step section 13 is not provided.

Also, as shown in FIG. 7, an angle θ1 which is formed between the step surface 13*a* formed by the dislocation process and the upper surface 11*a* of the central part 11 is, for example, a right angle or an acute angle smaller than a right angle. In the example shown in FIG. 7, the angle θ1 which is formed between the step surface 13*a* and the upper surface 11*a* of the central part 11 is a right angle)(90°. In this way, when the step surface 13*a* provided so as to make a right angle or an acute angle with respect to a travelling direction of the detachment is arranged, the development can be suppressed more reliably.

Figure 10:
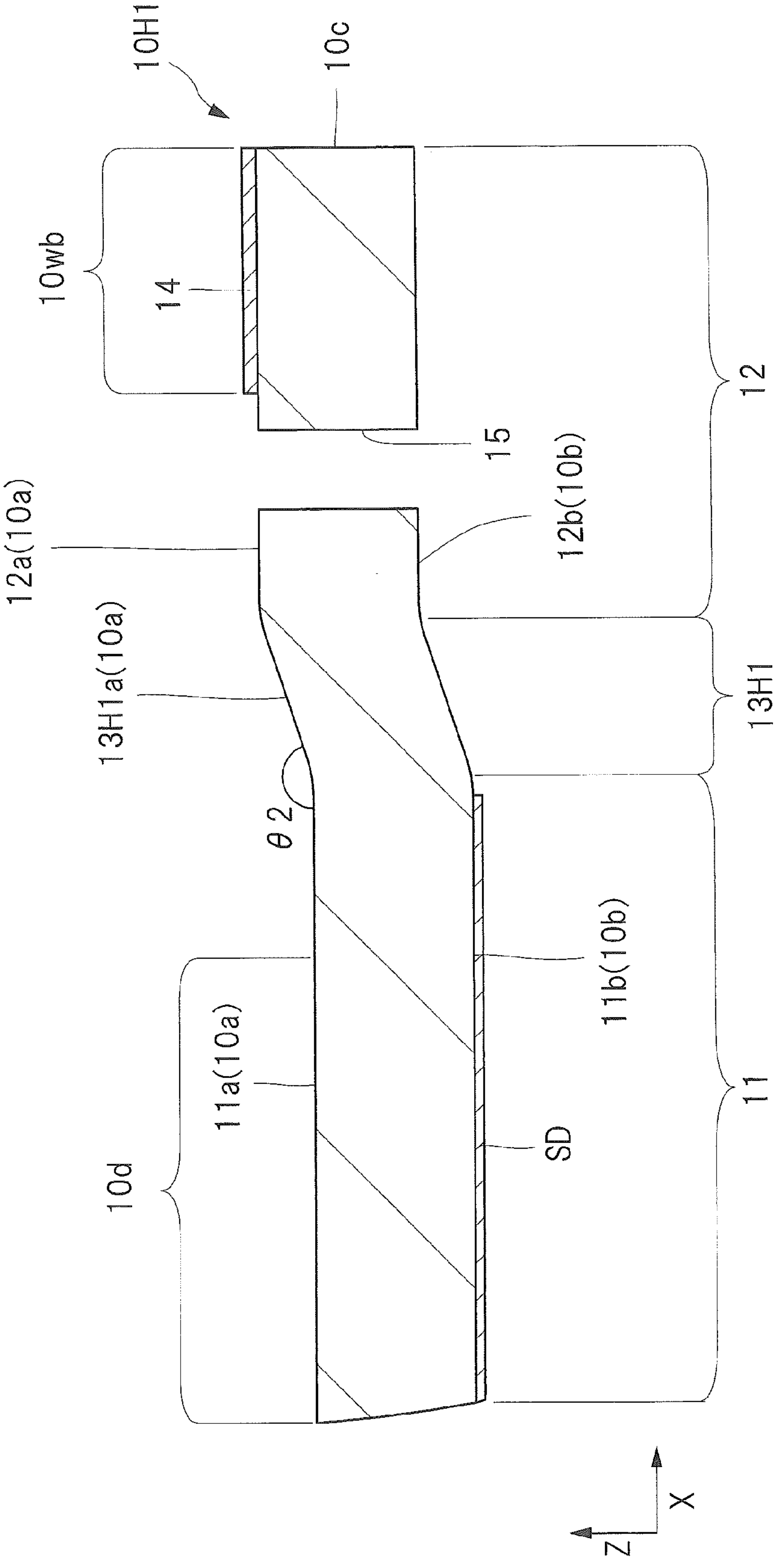
FIG. 10 is an enlarged sectional view of a die pad showing an examination case with respect to FIG. 9.

Incidentally, as a configuration where the peripheral edge part 12 is arranged at a position higher than the central part 11 and the wire connection region 10*wb* is provided in the peripheral edge part 12, an embodiment in which a bending section 13H1 is formed by performing the bending process between the peripheral edge part 12 and the central part 11 like the die pad 10 of an examination case shown in FIG. 10 is conceivable. FIG. 10 is an enlarged sectional view of the die pad showing an examination case with respect to FIG. 9. The bending process by the metal stamping is performed to the bending section 13H1 of a die pad 10H1 shown in FIG. 10 like the outer lead part 4*b* of the lead 4 shown in FIG. 4. The upper surface 10*a* of the bending section 13H1 is an inclined surface 13H1*a* which is inclined with respect to the upper surface 11*a* of the central part 11 and the upper surface 12*a* of the peripheral edge part 12.

When the inclined surface 13H1*a* is provided between the wire connection region 10*wb* of the peripheral edge part 12 and the chip mounting region 10*d* of the central part 11 like the die pad 10H1, the development of the detachment can be suppressed as compared with a die pad having a flat structure (not shown). However, the inclined surface 13H1*a* formed by the bending process is difficult to be formed in a steep angle like the step surface 13*a* shown in FIG. 7. Therefore, as shown in FIG. 10, since an angle θ2 which is formed between the inclined surface 13H1*a* formed by the bending process and the upper surface 11*a* of the central part 11 is an obtuse angle larger than a right angle, an effect to suppress the development of the detachment is relatively lower than the embodiment shown in FIG. 7. In other words, when the step surface 13*a* is formed by the dislocation process as shown in FIG. 7, an effect to suppress the development of the detachment increases as compared with the embodiment where the inclined surface 13H1*a* is formed by the bending process as shown in FIG. 10.

Also, when the inclined surface 13H1*a* is formed by the bending process, a planar size of the die pad 10H1 increases because an arrangement space for the bending section 13H1 is required in a planar view. On the other hand, when the step surface 13*a* is formed by the dislocation process as shown in FIG. 7, a planar size of the die pad 10 can be reduced because an arrangement space for the step section 13 is scarcely required in a planar view.

Also, when the inclined surface 13H1*a* is formed by the bending process, a corner at the boundary between the upper surface 11*a* of the central part 11 and the inclined surface 13H1*a* is likely to be rounded in a sectional view (that is, sectional view shown in FIG. 10) in a direction perpendicular to the upper surface 11*a*. On the other hand, when the step surface 13*a* which is the shear surface is formed by the dislocation process as shown in FIG. 7, the corner at the boundary between the upper surface 11*a* of the central part 11 and the step surface 13*a* is unlikely to be rounded. Note that, although the corner may be rounded microscopically even in the case of the dislocation process, a radius (R diameter) of the rounded portion is extremely smaller as compared with the case of the bending process. In other words, in the example shown in FIG. 7, an inflection point (inflection line) at which an angle of inclination with respect to the upper surface 11*a* changes exists at the boundary between the upper surface 11*a* of the central part 11 and the step surface 13*a*.

In this way, by forming the step surface 13*a* so that the inflection point at which the angle of inclination changes with respect to the travelling direction of the detachment exists, the development of the detachment can be easily suppressed at the inflection point. Also, although not shown, for example, as a method of forming the step surface 13*a* which makes a right angle with respect to the upper surface 11*a* of the central part 11 like the step surface 13*a* shown in FIG. 7, an embodiment where the step surface is formed by removing a part of the central part 11 of the die pad 10 by a removal treatment using chemical reaction such as an etching process is also conceivable. However, when the step surface 13*a* is formed by the etching process, the corner at the boundary between the upper surface 11*a* of the central part 11 and the step surface 13*a* is likely to be rounded. Therefore, from a viewpoint of suppressing the development of the detachment, it is particularly preferred to form the step surface 13*a* by the dislocation process as shown in FIG. 7.

Also, the dislocation amount between the central part 11 and the peripheral edge part 12 shown in FIG. 7, that is, the height of the step surfaces 13*a* and 13*b* is a half or less of the thickness of the die pad 10 (length in a Z direction in the example shown in FIG. 7), for example, about ⅓ thereof. In the example shown in FIG. 7, the thickness of the central part 11 and the peripheral edge part 12 is about 150 μm. Meanwhile, the height of the step surfaces 13*a* and 13*b*, that is, the length in the Z direction is about 50 μm.

As shown in FIG. 7, when the dislocation process is performed, the thickness of a connecting part 13*j* located between the step surfaces 13*a* and 13*b* is smaller than the thickness of an object to be processed (die pad 10 in the present embodiment). Therefore, from a viewpoint of increasing the strength of the connecting part 13*j* which connects the central part 11 and the peripheral edge part 12 of the die pad 10, it is preferred that the height of the step surfaces 13*a* and 13*b* is set to a half or less of the thickness of the die pad 10. In the example shown in FIG. 7, the thickness of the connecting part 13*j* is about 100 μm.

In addition, in the example shown in FIG. 7, a plurality of slits 15 are formed between the wire connection region 10*wb* and the step surfaces 13*a*. The slit 15 is a penetrating groove formed so as to penetrate from one surface to the other surface of the upper surface 12*a* and the lower surface 12*b* of the peripheral edge part 12 of the die pad 10.

As described above, since the step surfaces 13*a* and 13*b* are formed by the dislocation process in the present embodiment, the position of the lower surface 12*b* of the peripheral edge part 12 is located at the position higher than the lower surface 11*b* of the central part 11. Therefore, as shown in FIG. 9, the lower surface 12*b* of the peripheral edge part 12 is covered with the sealing body 7. In addition, in the present embodiment, since the wire connection region 10*wb* is provided in the peripheral edge part 12, the width of the peripheral edge part 12 (length in the direction perpendicular to the extending direction, length in the X direction in FIG. 7) increases. For example, in the example shown in FIG. 7, the width of the peripheral edge part 12 is larger than the thickness of the peripheral edge part 12 and is about 2 mm.

Incidentally, as a cause of the detachment of the die pad 10 and the sealing body 7, a mode where detachment occurs in an adhesive part between the semiconductor chip 3 and the die pad 10 and the detachment develops toward the peripheral edge part 12 of the die pad 10 has been described. However, in the case of the semiconductor device of the type in which a part of the lower surface 10*b* of the die pad 10 (lower surface 11*b*) is exposed from the sealing body 7 like the present embodiment, there is another mode as a cause of the detachment of the die pad 10 and the sealing body 7. More specifically, there may be a case where moisture enters through the contact interface between the sealing body 7 and the die pad 10 in the exposed part (lower surface 11*b*) of the die pad 10 and the sealing body 7 is detached from the die pad 10 due to this moisture. The moisture from the lower surface 11*b* side which will become the cause of the detachment mode mainly enters from the outside of the package. If the sealing body 7 and the die pad 10 are in close contact with each other at the edge part of the exposed part of the die pad 10, it is possible to prevent the entry of moisture. However, if there is a gap between the die pad 10 and the sealing body 7, the moisture which has entered the gap comes into the inside along the die pad 10, which deteriorates the adhesiveness between the die pad 10 and the sealing body 7.

In the present embodiment, although details will be described later, the sealing body 7 shown in FIG. 9 is formed by a so-called transfer-mold method in which a softened resin is injected into a molding die (not shown) and is then hardened. In this case, when an area of the lower surface 12*b* of the peripheral edge part 12 becomes wide like the present embodiment, it becomes difficult to supply the resin so as to cover the whole lower surface 12*b*. Then, when the gap is formed between the peripheral edge part 12 and the sealing body 7, it is apprehended that the moisture enters through the gap as described above and becomes the cause of deteriorating the adhesiveness between the die pad 10 and the sealing body 7.

Therefore, from a viewpoint of reducing the gap between the sealing body 7 and the die pad 10 which will be a cause of the entry of moisture, it is preferred that the slit 15 is provided between the wire connection region 10*wb* and the step surface 13*a* like the present embodiment in order to reliably supply the resin to the lower surface 12*b* side of the peripheral edge part 12 having the large area. If the slit 15 is provided, the slit 15 can be utilized as a flow path of the resin or gas when the sealing body 7 is formed by the transfer-mold method. Therefore, filling properties of the resin to the lower surface 12*b* side of the peripheral edge part 12 are enhanced.

In addition, in the example shown in FIG. 9, the slit 15 is provided between the wire connection region 10*wb* and the central part 11, that is, at a position closer to the step surface 13*a* than the side surface 10*c* in the peripheral edge part 12. As a result, the filling properties of the resin to the lower surface 12*b* side of the peripheral edge part 12 are further enhanced, and the lower surface 12*b* of the peripheral edge part 12 and the step surface 13*b* on the lower surface 10*b* side can be covered with the resin (sealing body 7).

If the above-mentioned development of the detachment passes over the step surface 13*a* and reaches the upper surface 12*a* side of the peripheral edge part 12, the development of the detachment can be suppressed by the slit 15 provided between the wire connection region 10*wb* and the step surface 13*a*. However, in order to provide the wire connection region 10*wb* in the peripheral edge part 12 and electrically connect the lower surface 11*b* of the central part 11 to the peripheral edge part 12, the slit 15 cannot be provided continuously so as to surround the circumference of the step section 13 in a planar view.

For example, in the example shown in FIG. 6, the slit 15 is not formed on the extended line of the suspension lead 9. Also, the connecting part 12*j* which connects the wire connection region 10*wb* and the central part 11 is provided at a center portion of each side of the die pad 10. In other words, in the present embodiment, the die pad 10 has a plurality of slits 15 arranged so as to intermittently surround the circumference of the central part 11.

Therefore, for example, when a section which continuously surrounds the circumference of the chip mounting region 10*d* like the step section 13 shown in FIG. 6 is not provided and it is tried to prevent the development of the detachment by the slit 15 only, the detachment will develop up to the wire connection region 10*wb* after coming around from a portion on the extended line of the suspension lead 9 and the connecting part 12*j*. More specifically, in the present embodiment, by providing the step surface 13*a* (step section 13) so as to continuously surround the circumference of the chip mounting region 10*d* and providing the slit 15 between the step surface 13*a* and the wire connection region 10*wb*, the development of the detachment up to the wire connection region 10*wb* can be prevented more reliably.

Also, in the example shown in FIGS. 6 and 7, in the wire connection region 10*wb* provided in a part of the upper surface 12*a* of the peripheral edge part 12, a metal film 14 which is a plating film made of, for example, silver (Ag) or gold (Au) is formed. By forming the metal film 14 made of silver (Ag) or gold (Au) on the surface of the wire connection region 10*wb* of the die pad 10, the bonding strength with the wire 5 made of gold (Au) can be enhanced.

<Manufacturing Process of Semiconductor Device>

Figure 11:
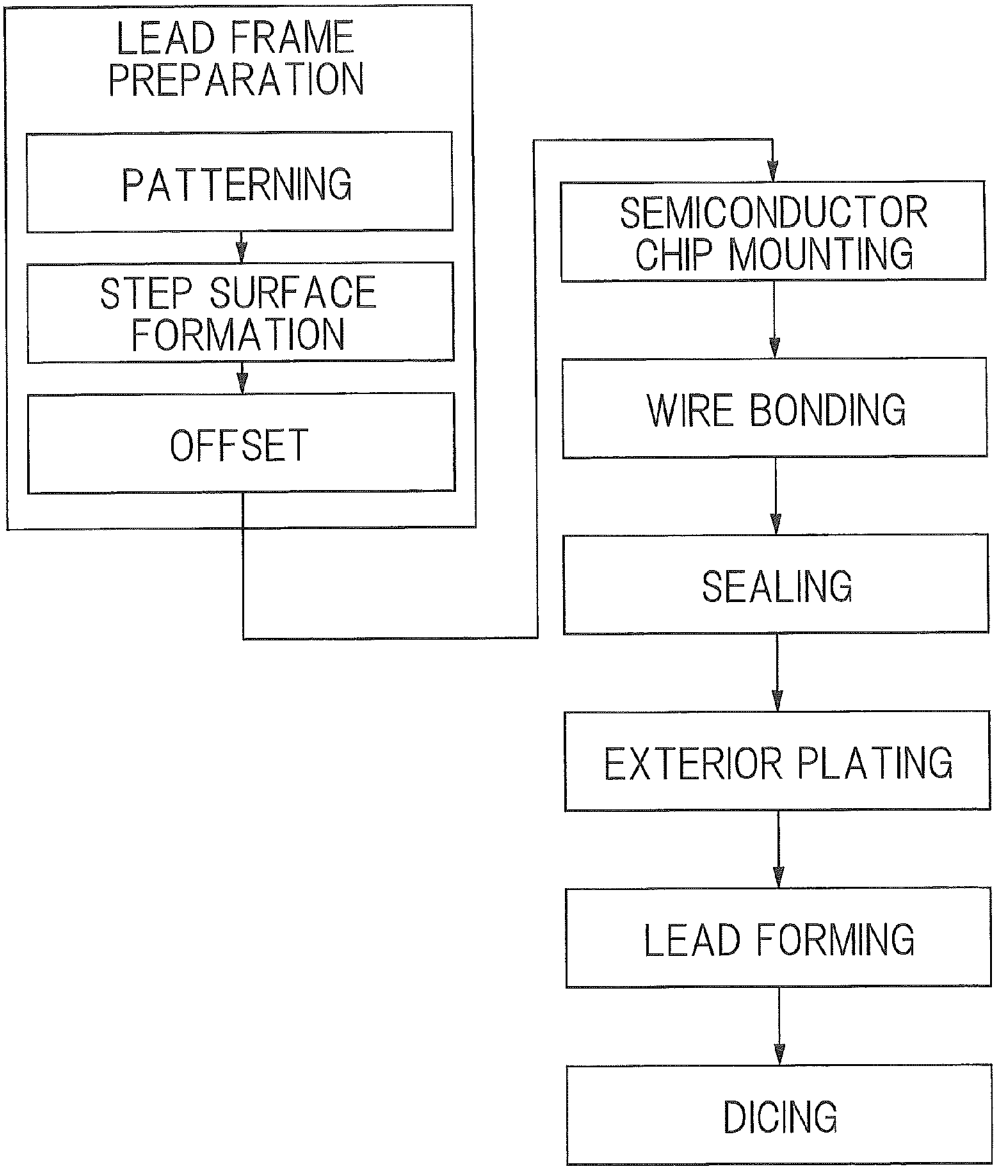
FIG. 11 is an explanatory diagram showing an assembly flow of the semiconductor device shown in FIGS. 1 to 10.

Next, a manufacturing process of the semiconductor device 1 described with reference to FIGS. 1 to 9 will be described. The semiconductor device 1 in the present embodiment is manufactured in accordance with an assembly flow shown in FIG. 11. FIG. 11 is an explanatory diagram showing the assembly flow of the semiconductor device shown in FIGS. 1 to 9.

1. Lead Frame Preparatory Process

Figure 12:
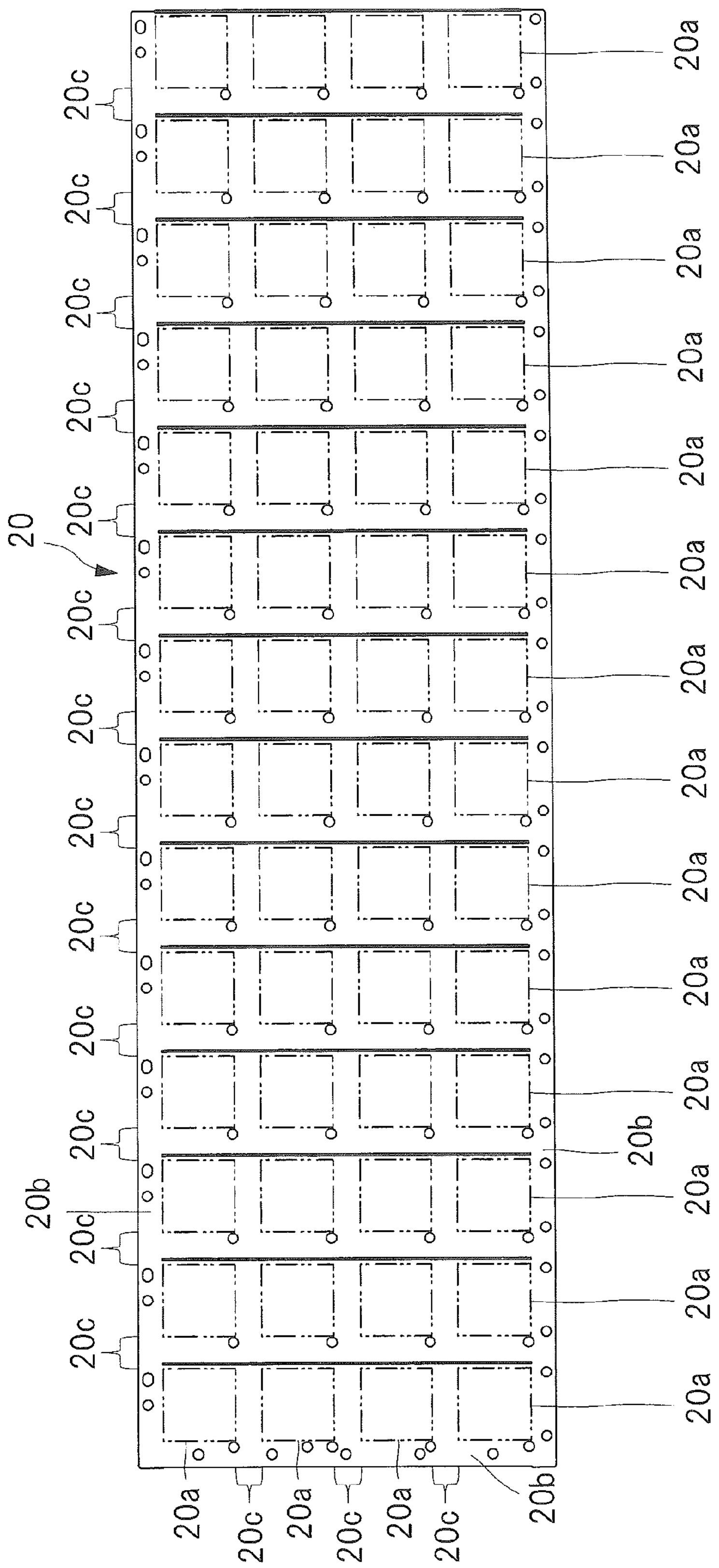
FIG. 12 is a plan view showing an entire structure of a lead frame prepared in a lead frame preparatory process of FIG. 11.
Figure 13:
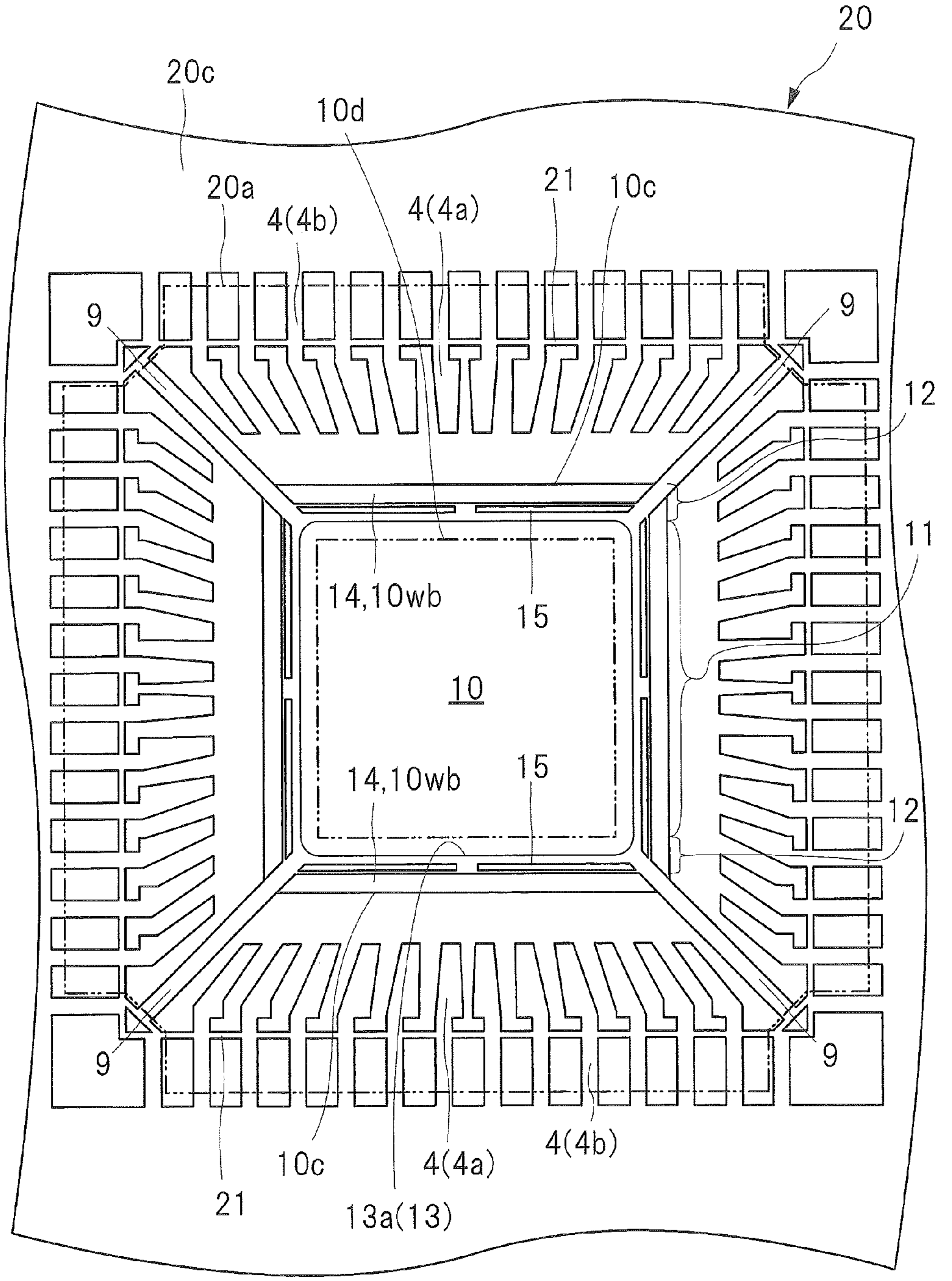
FIG. 13 is an enlarged plan view of a part of a plurality of product formation parts shown in FIG. 12.
Figure 14:
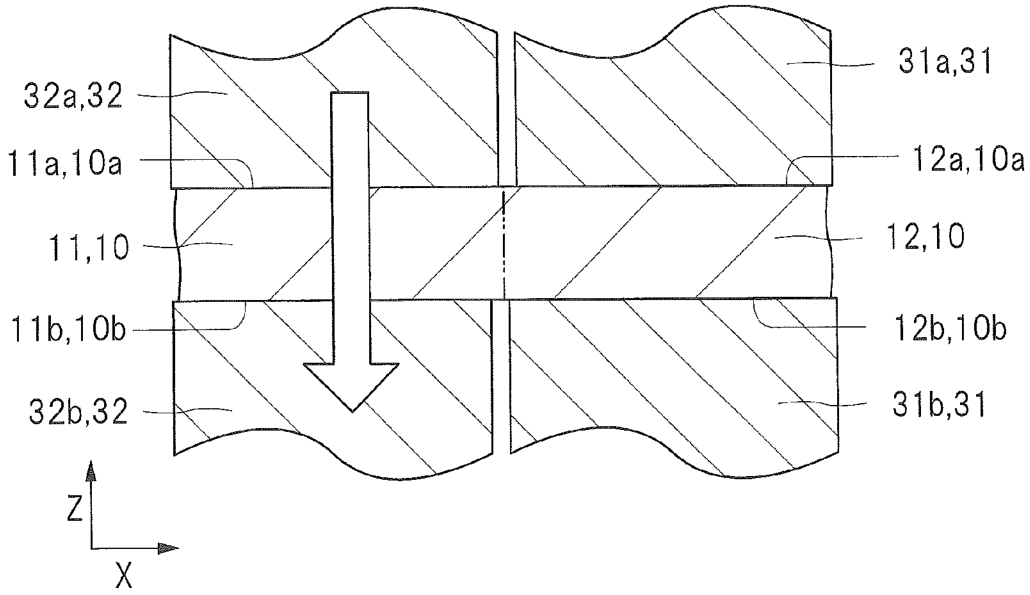
FIG. 14 is an enlarged sectional view showing a state immediately before a step surface is formed in a step surface formation process shown in FIG. 11.
Figure 15:
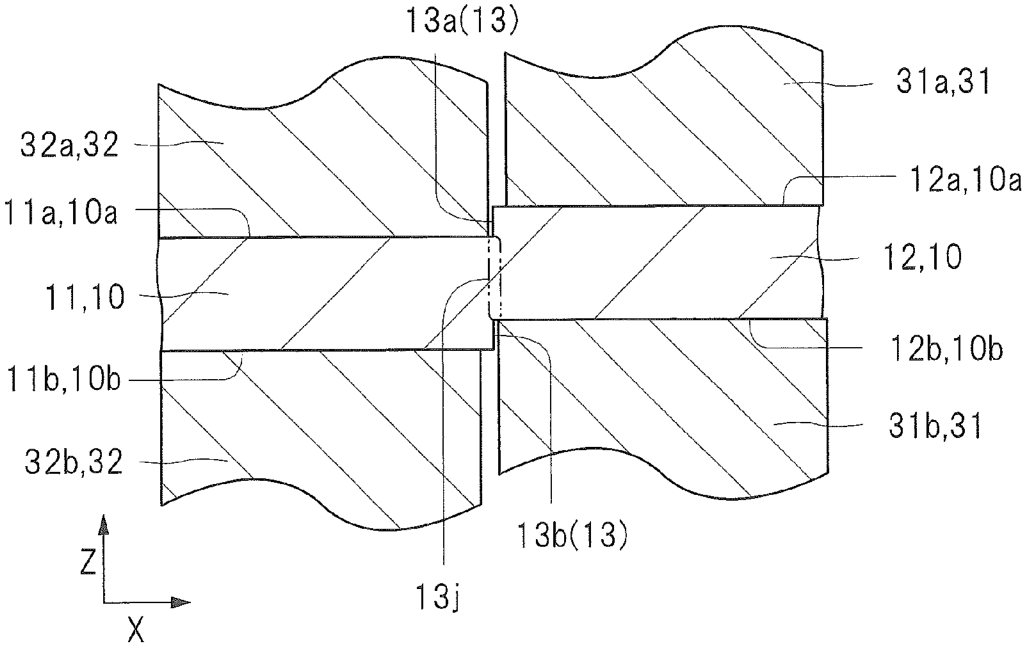
FIG. 15 is an enlarged sectional view showing a state where the step surface is formed by performing the metal stamping to the die pad shown in FIG. 14.
Figure 16:
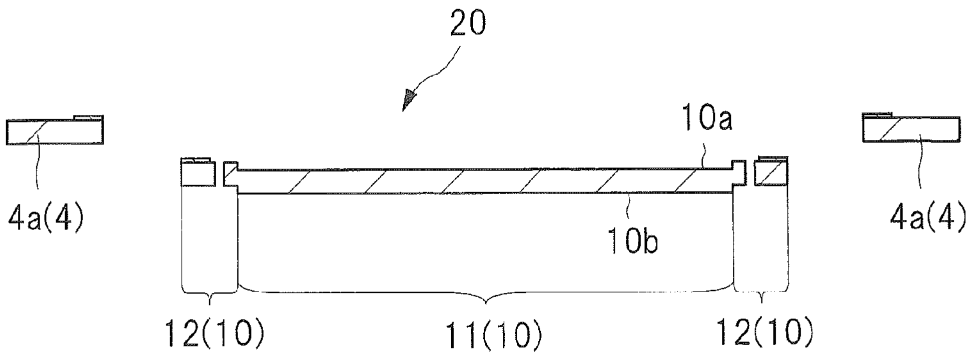
FIG. 16 is an enlarged sectional view taken along an extending direction of a lead of a lead frame shown in FIG. 13.
Figure 17:
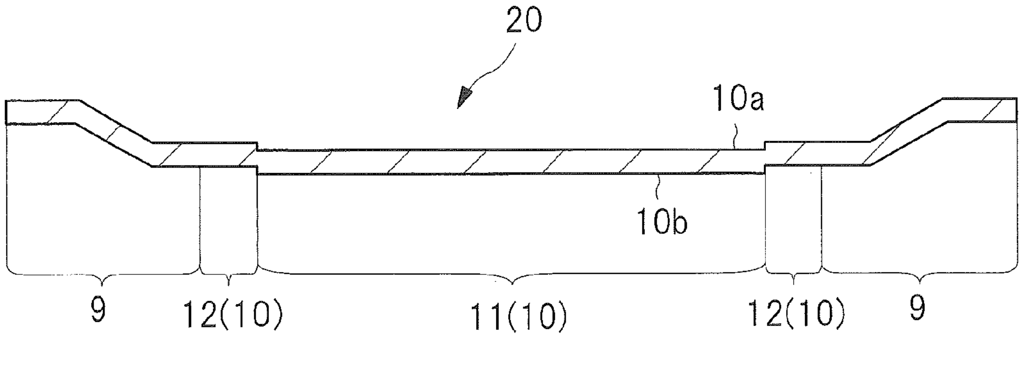
FIG. 17 is an enlarged sectional view taken along an extending direction of a suspension lead of the lead frame shown in FIG. 13.

First, as the lead frame preparatory process shown in FIG. 11, a lead frame 20 as shown in FIG. 12 is prepared. FIG. 12 is a plan view showing an entire structure of the lead frame prepared in the lead frame preparatory process of FIG. 11 and FIG. 13 is an enlarged plan view of a part of a plurality of product formation parts shown in FIG. 12. Also, FIG. 14 is an enlarged sectional view showing a state immediately before a step surface is formed in the step surface formation process shown in FIG. 11 and FIG. 15 is an enlarged sectional view showing a state where the step surface is formed by performing the metal stamping to the die pad shown in FIG. 14. FIG. 16 is an enlarged sectional view taken along an extending direction of the lead of the lead frame shown in FIG. 13 and FIG. 17 is an enlarged sectional view taken along the extending direction of the suspension lead of the lead frame shown in FIG. 13.

The lead frame 20 prepared in this process is provided with a plurality of product formation parts 20*a* inside an outer frame 20*b*. In the example shown in FIG. 12, in the lead frame 20, 14 pieces of the product formation parts 20*a* are arranged in a row direction and 4 pieces are arranged in a column direction, and a total of 56 pieces of the product formation parts 20*a* are arranged in a matrix form. The lead frame 20 is made of, for example, a metal film containing copper (Cu) as a main constituent.

Also, a frame part (dam part) 20*c* which surrounds a circumference of each product formation part 20*a* is arranged between each product formation part 20*a*. As shown in FIG. 13, the frame part 20*c* is formed so as to surround the circumference of the plurality of leads 4, and is formed integrally with the outer frame 20*b* shown in FIG. 12.

Also, as shown in FIG. 13, the die pad 10 which forms a rectangle in a planar view is formed at the central part of each product formation part 20*a*. At the four corner parts of the die pad 10, the suspension leads 9 are connected and are arranged so as to extend toward the corner parts of the product formation part 20*a*. In addition, in the circumference of the die pad 10, the plurality of leads 4 are formed between the plurality of suspension leads 9. The plurality of leads 4 are each connected to the frame part 20*c* arranged outside the plurality of leads 4 with respect to the die pad 10. In other words, the lead frame 20 is provided with the frame part 20*c*, the die pad 10 arranged inside the frame part 20*c* in a planar view, the plurality of suspension leads 9 which connect the die pad 10 and the frame part 20*c*, and the plurality of leads 4 which are arranged between the die pad 10 and the frame part 20*c* and are connected to the frame part 20*c*. Also, the plurality of leads 4 are connected via a tie bar (dam part) 21. This tie bar 21 functions as a dam part which dams the leakage of the resin in the sealing body formation process described later. More specifically, the outline of the sealing body 7 (see FIG. 1) in a planar view is defined by the tie bar 21 surrounding the circumference of the die pad 10.

Also, the upper surface 10*a* of the die pad 10 arranged at the center of each product formation part 20*a* has the central part 11 which is a portion including the chip mounting region 10*d* and the peripheral edge part 12 which is a portion provided so as to surround the central part 11 in a planar view. In addition, at the boundary between the central part 11 and the peripheral edge part 12, the step surface 13*a* (step section 13) is provided so that a height of the peripheral edge part 12 becomes higher than a height of the central part 11. As described with reference to FIG. 7, on the lower surface 10*b* side of the die pad 10 and at the boundary between the central part 11 and the peripheral edge part 12, the step surface 13*b* (step section 13) is provided so that the lower surface 12*b* of the peripheral edge part 12 is located at a position higher than the lower surface 11*b* of the central part 11.

Also, on the upper surface 12*a* of the peripheral edge part 12, the wire connection region (wire bonding region) 10*wb* in which a wire is bonded in the wire bonding process described later is provided. In the wire connection region 10*wb* provided in a part of the upper surface 12*a* of the peripheral edge part 12, the metal film 14 which is a plating film made of, for example, silver (Ag) or gold (Au) is formed. In addition, between the wire connection region 10*wb* and the step surfaces 13*a*, the plurality of slits 15 which penetrate from one surface to the other surface of the upper surface 12*a* and the lower surface 12*b* of the peripheral edge part are formed as shown in FIG. 7.

For example, the above-mentioned lead frame 20 is manufactured by the flow shown in FIG. 11. First, in a patterning process, a metal plate (not shown) to be a base material is prepared, and outline shapes of component members (die pad 10, a plurality of leads 4, and tie bar 21) in the product formation part 20*a* shown in FIG. 13 are formed on the metal plate. Although the forming method is not particularly limited, these can be formed by, for example, the metal stamping using a punch and a die or by the etching. The plurality of slits 15 shown in FIG. 13 can be formed simultaneously with the plurality of leads 4 in this process.

Next, in the step surface formation process, as shown in FIG. 7, the step surface 13*a* is formed on the upper surface 10*a* of the die pad 10 and the step surface 13*b* is formed on the lower surface 10*b* of the die pad 10, respectively. The step section 13 shown in FIG. 7 is formed by performing the metal stamping in a state where the peripheral edge part 12 and the central part 11 are held by respectively separate jigs (shearing jig) 31 and 32 as shown in FIGS. 14 and 15.

As shown in FIGS. 14 and 15, the peripheral edge part 12 and the central part 11 are sandwiched and held by the jig 31 and the jig 32, respectively. The jig 31 has an upper jig 31*a* and a lower jig 31*b*, and the peripheral edge part 12 is sandwiched and fixed in a state where the upper jig 31*a* and the lower jig 31*b* are made to abut on the upper surface 12*a* and the lower surface 12*b* which are surfaces to be held of the peripheral edge part 12, respectively. On the other hand, the jig 32 has an upper jig 32*a* and a lower jig 32*b*, and the chip connection part 12 is sandwiched and fixed in a state where the upper jig 32*a* and the lower jig 32*b* are made to abut on the upper surface 11*a* and the lower surface 11*b* of the central part 11, respectively.

Also, the jigs 31 and 32 can be moved independently of each other, and relative positional relation between the jigs 31 and 32 can be dislocated along the thickness direction (Z direction) of the die pad 10 as schematically shown with an arrow in FIG. 14. As shown in FIG. 14, in a state where the peripheral edge part 12 and the central part 11 are held independently by the jigs 31 and 32, respectively, a pressing force is applied to the jigs 31 and 32 in the thickness direction of the die pad 10 (that is, metal stamping is performed). At this time, since the pressing force is applied from the jigs 31 and 32 to the boundary portion between the peripheral edge part 12 and the central part 11 of the die pad 10 in a concentrated manner, the positional relation in the thickness direction between the peripheral edge part 12 and the central part 11 is dislocated.

At this time, a part of the boundary portion is shear-deformed by the pressing force transmitted from the jigs 31 and 32 at the boundary portion between the peripheral edge part 12 and the central part 11 of the die pad 10. Note that, by adjusting the dislocation amount of the jigs 31 and 32, the boundary portion between the peripheral edge part 12 and the central part 11 can be left in a partly-connected state without cutting it completely.

More specifically, when the dislocation process is performed, the connecting part 13*j* which connects the peripheral edge part 12 and the central part 11, the step surface 13*b* extending downward from the lower end of the connecting part 13*j*, and the step surface 13*a* extending upward from the upper end of the connecting part 13*j* are simultaneously formed in the die pad 10 as shown in FIG. 15.

The step surface 13*a* is the shear surface formed by the shear deformation of a part of the upper surface 10*a* of the die pad 10 by the upper jig 32*a* pressed downward, and is continuous with the upper surface 12*a* of the peripheral edge part 12 and the upper surface 11*a* of the central part 11 which are different in height. In addition, since the step surface 13*a* is formed by the shear deformation, an angle formed between the upper surface 11*a* and the upper surface 12*a* can be made steep. For example, angles formed between each of the upper surface 11*a* and upper surface 12*a* and the step surface 13*a* can be set to 90 degrees.

Also, the step surface 13*b* is the shear surface formed by the shear deformation of a part of the lower surface 10*b* of the die pad 10 by the lower jig 31*b* pressed upward, and is continuous with the lower surface 12*b* of the peripheral edge part 12 and the lower surface 11*b* of the central part 11 which are different in height. In addition, since the step surface 13*b* is formed by the shear deformation, an angle formed between the lower surface 11*b* and the lower surface 12*b* can be made steep. For example, angles formed between each of the lower surface 11*b* and lower surface 12*b* and the step surface 13*b* can be set to 90 degrees.

In this way, since the step section 13 is formed by the dislocation process as described above, the arrangement space for the step section 13 in a planar view is scarcely needed (see FIG. 6). Also, since the die pad 10 is deformed in a thickness direction in a state where the die pad 10 is sandwiched by the jigs 31 and 32 in the above-mentioned dislocation process, the step section 13 can be formed in the same process as the process of performing the bending process to the suspension leads 9 shown in FIG. 17 in the offset process shown in FIG. 11 except for the point that a shape of the jig for the deformation is different.

Also, since a part of the die pads 10 is shear-deformed in the case of the above-mentioned dislocation process, a repulsive force after the dislocation process, that is, a force to return to the original shape of the processed die pad 10 is small (almost nothing). Therefore, if the movement amount of the jigs 31 and 32 can be controlled, the height difference between the lower surface 11*b* of the central part 11 and the lower surface 12*b* of the peripheral edge part 12 can be accurately controlled.

Next, in an offset process, the process (offset process) is performed so that a position (height) of the upper surface 10*a* of the die pad 10 is located at a position lower than a position (height) of the lead 4 (inner lead part 4*a*) as shown in FIG. 16. As the method of the offset process, for example, the metal stamping is performed by using a pressing die to deform the suspension leads 9 shown in FIG. 17, thereby forming the offset arrangement (down-set arrangement).

2. Mounting Process of Semiconductor Chip

Figure 18:
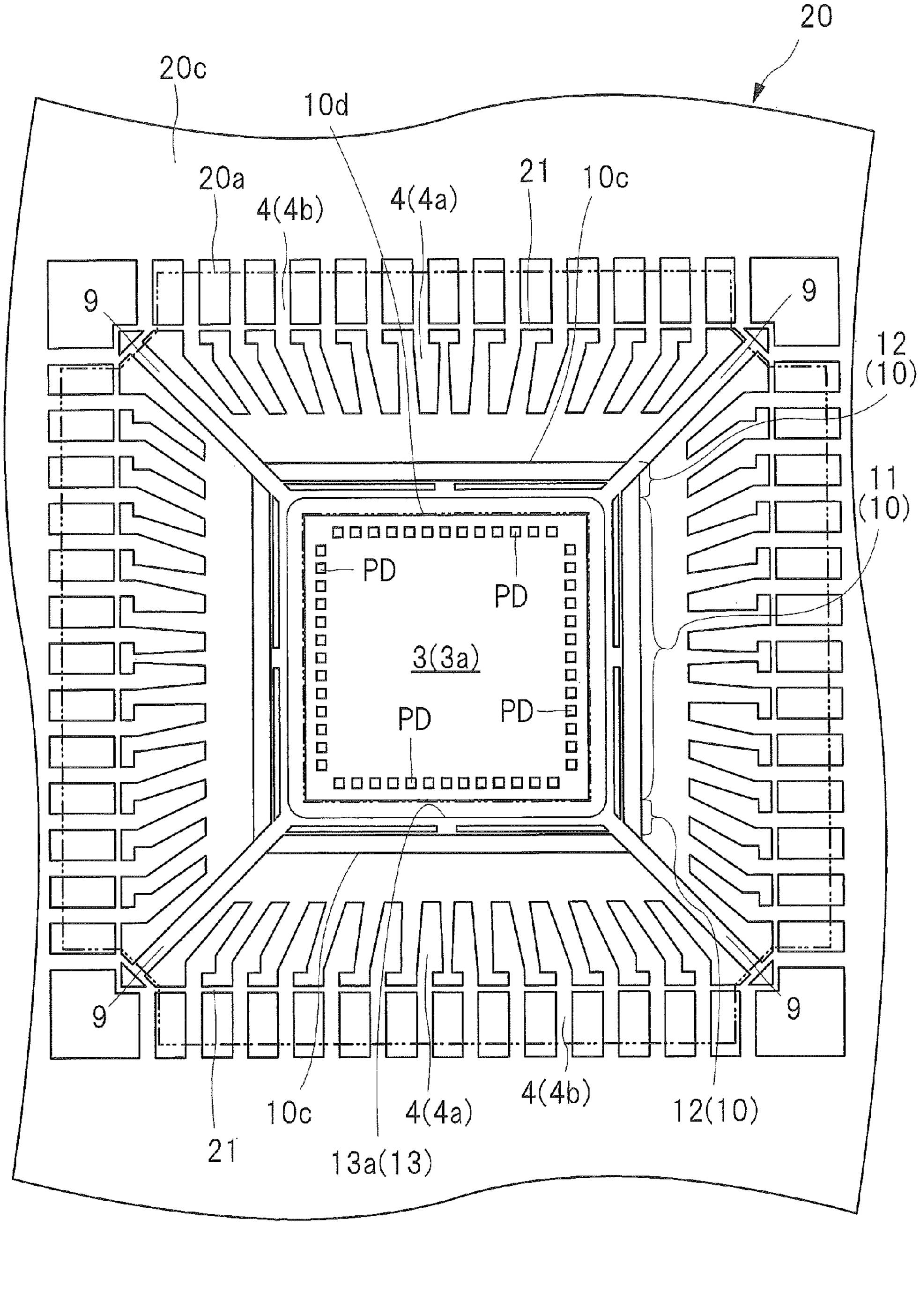
FIG. 18 is an enlarged plan view showing a state where the semiconductor chip is mounted via a bonding material on the die pad shown in FIG. 13.
Figure 19:
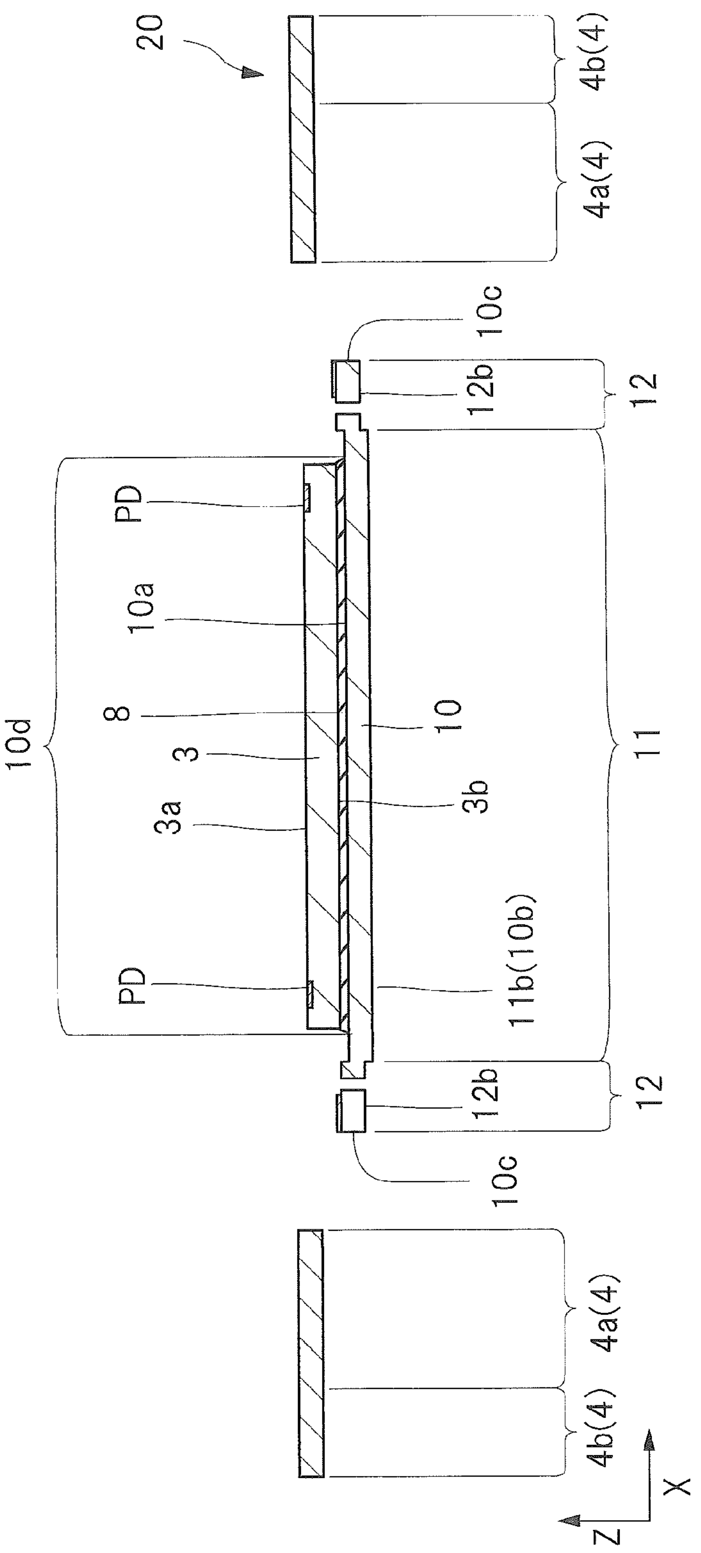
FIG. 19 is an enlarged sectional view showing a state where the semiconductor chip is mounted via a bonding material on the die pad shown in FIG. 16.

Next, as the mounting process of a semiconductor chip shown in FIG. 11, the semiconductor chip 3 is mounted via the die bonding material 8 on the die pad 10 as shown in FIGS. 18 and 19. FIG. 18 is an enlarged plan view showing a state where the semiconductor chip is mounted via a bonding material on the die pad shown in FIG. 13 and FIG. 19 is an enlarged sectional view showing a state where the semiconductor chip is mounted via a bonding material on the die pad shown in FIG. 16.

In the present embodiment, as shown in FIG. 19, the so-called face-up mounting method is adopted, in which the semiconductor chip 3 is mounted in a state where the rear surface 3*b* (surface opposite to the front surface 3*a* on which the plurality of pads PD are formed) of the semiconductor chip 3 is opposed to the upper surface 10*a* of the die pad 10. In addition, as shown in FIG. 18, the semiconductor chip 3 is mounted on the chip mounting region 10*d* of the central part 11 of the die pad 10 so that each side of the front surface 3*a* is arranged along each side of the die pad 10.

In the present embodiment, for example, the semiconductor chip 3 is mounted via the die bonding material 8 (see FIG. 19) which is the epoxy-based thermosetting resin, and the die bonding material 8 is a paste material which has fluidity before being hardened (thermally hardened). When the paste material is used as the die bonding material 8 in this way, the die bonding material 8 is first applied on the die pad 10, and the rear surface 3*b* of the semiconductor chip 3 is then adhered to the upper surface 10*a* of the die pad 10. Thereafter, by hardening the die bonding material 8 (for example, performing thermal treatment) after the adhesion, the semiconductor chip 3 is fixed on the die pad 10 via the die bonding material 8 as shown in FIG. 19.

Note that, although an embodiment of using a paste material made of the thermosetting resin as the die bonding material 8 has been described in the present embodiment, various kinds of modifications are applicable. For example, an adhesive material composed of a tape material (film material) having adhesion layers on both surfaces instead of the paste material is attached on the rear surface 3*b* of the semiconductor chip 3 in advance, and the semiconductor chip 3 may be mounted on the die pad 10 via the tape material.

Also, in the present embodiment, the semiconductor chip 3 is mounted in a state where the whole upper surface 10*a* including the chip mounting region 10*d* has been roughened. For this reason, since an area of the contact interface between the die bonding material 8 and the die pad 10 is increased, the detachment of the die bonding material 8 can be suppressed. Therefore, although the surface roughness of the chip mounting region 10*d* does not matter from a viewpoint of stopping the development of the detachment, the surface roughness of the chip mounting region 10*d* is preferably made rougher than that of the lower surface 10*b* from a viewpoint of suppressing the detachment of the die bonding material 8 and the die pad 10.

3. Wire Bonding Process

Figure 20:
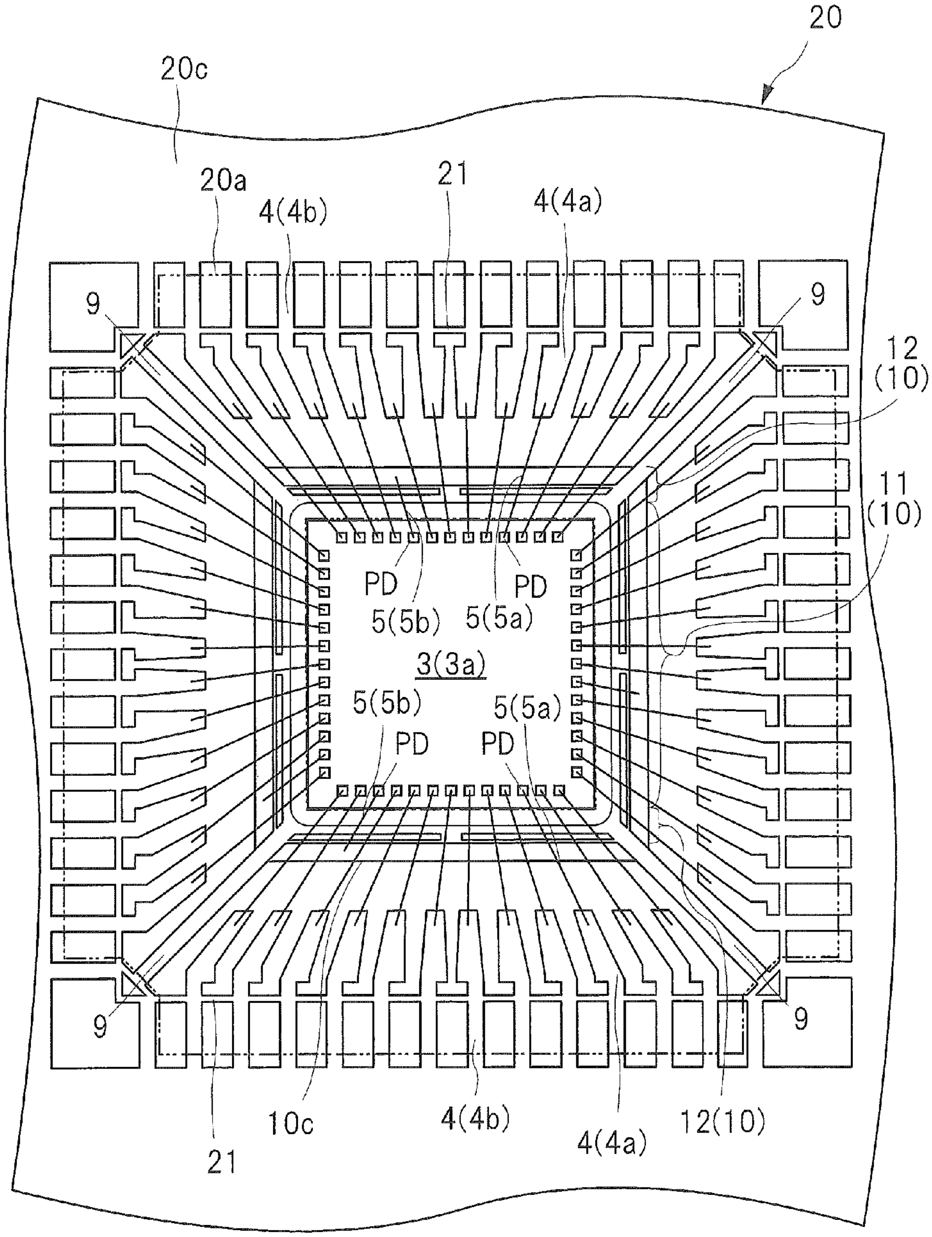
FIG. 20 is an enlarged plan view showing a state where the semiconductor chip, the plurality of leads and the die pad shown in FIG. 18 are electrically connected via wires.
Figure 21:
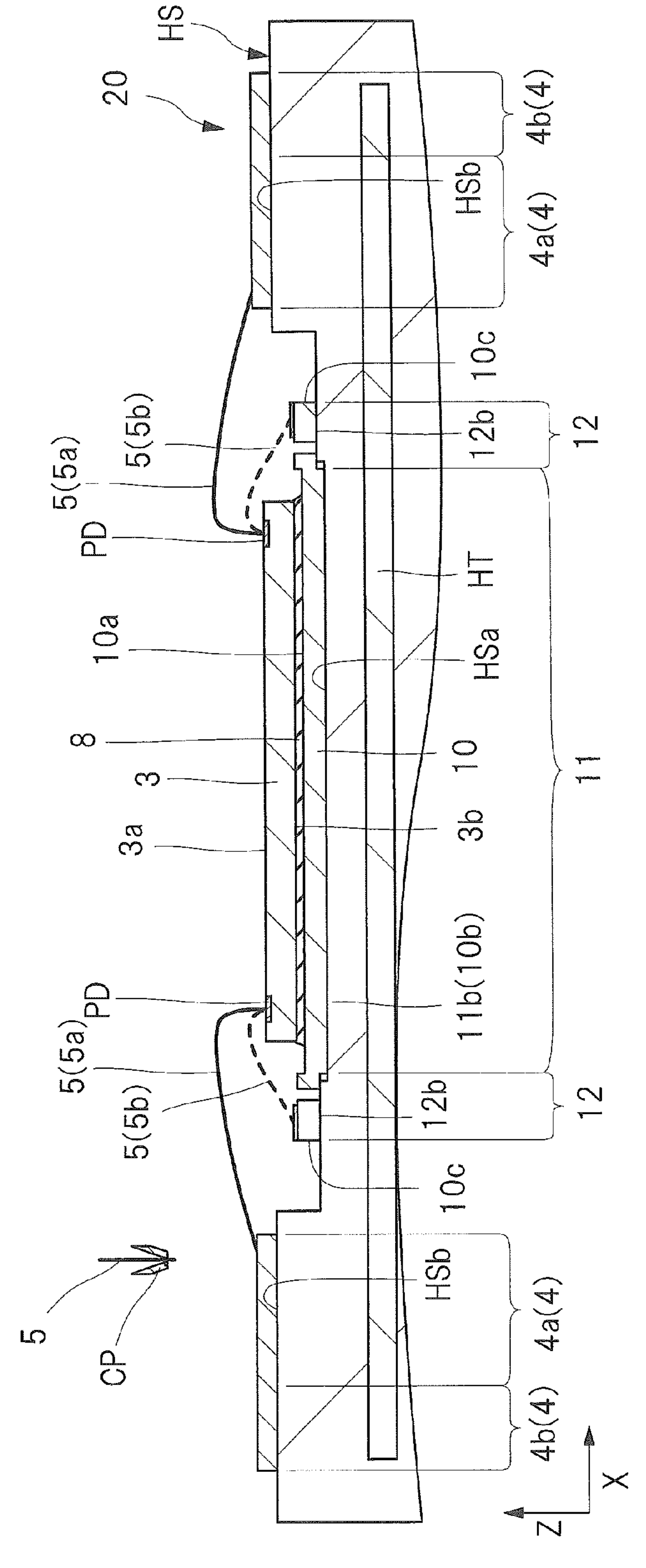
FIG. 21 is an enlarged sectional view showing a state where the semiconductor chip and the plurality of leads shown in FIG. 19 are electrically connected via wires.
Figure 22:
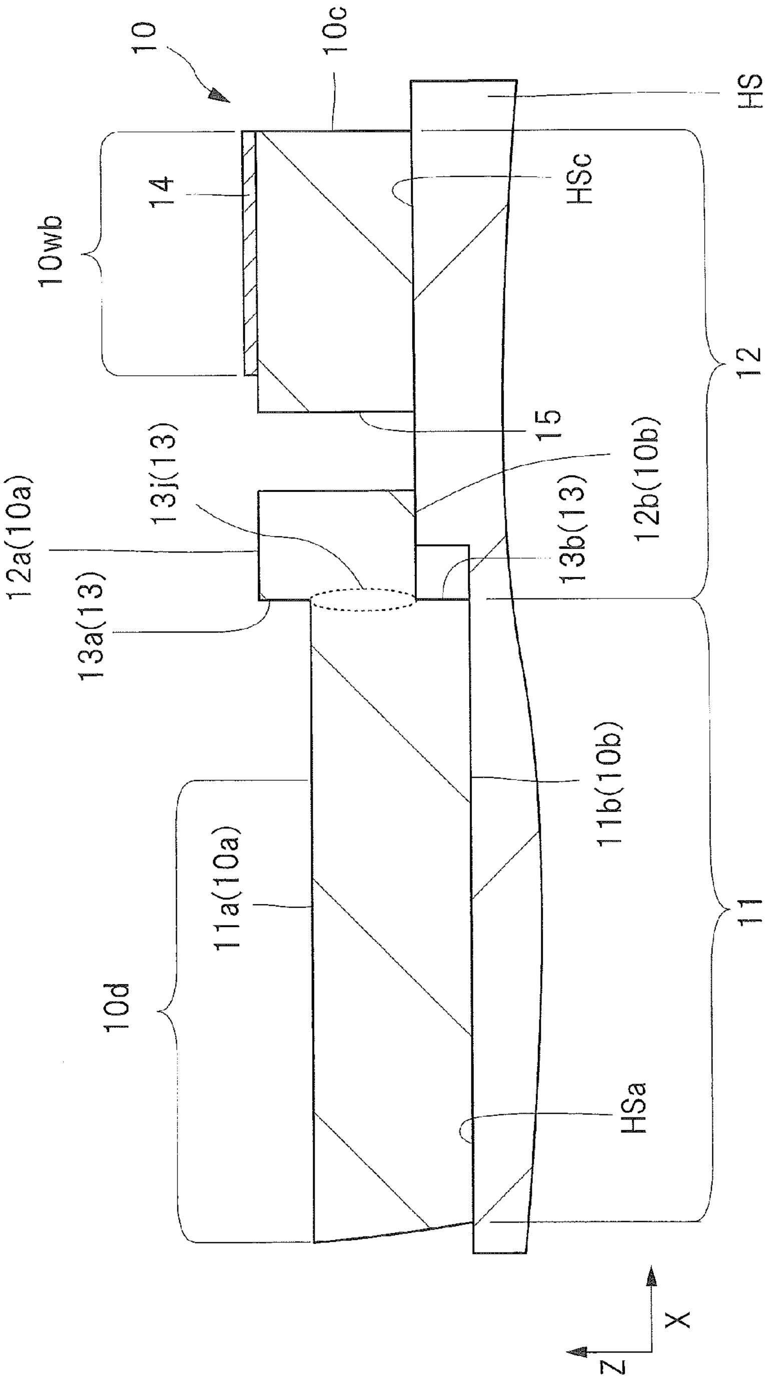
FIG. 22 is an enlarged sectional view showing a periphery of a wire connection region of the die pad of FIG. 21 in an enlarged manner.

Next, as the wire bonding process shown in FIG. 11, the plurality of pads PD of the semiconductor chip 3 and the plurality of leads 4 are electrically connected via the plurality of wires (conductive member) 5*a* as shown in FIGS. 20 and 21. Also, in this process, the semiconductor chip 3 and the die pad 10 are electrically connected via the wires 5*b*. FIG. 20 is an enlarged plan view showing a state where the semiconductor chip, the plurality of leads and the die pad shown in FIG. 18 are electrically connected via wires and FIG. 21 is an enlarged sectional view showing a state where the semiconductor chip and the plurality of leads shown in FIG. 19 are electrically connected via the wires. In addition, FIG. 22 is an enlarged sectional view showing a periphery of a wire connection region of the die pad of FIG. 21 in an enlarged manner.

In this process, for example, the lead frame 20 on which the semiconductor chip 3 is mounted on the die pad 10 of each product formation part 20*a* is placed on a heat stage (heating base) HS as shown in FIG. 21. Then, the plurality of pads PD of the semiconductor chip 3 and the plurality of leads 4 are electrically connected via the plurality of wires 5*a*. Also, in this process, some of the plurality of pads PD and the wire connection region 10*wb* (see FIG. 22) of the die pad 10 are electrically connected via the wires 5*b*. The wire 5 is made of metal, and is made of, for example, gold (Au) in the present embodiment. Also, the metal film 14 is formed on the upper surface 12*a* of the wire connection region 10*wb* as shown in FIG. 22, and the wire 5 is bonded to the metal film 14 in this process.

As a bonding method of the wire 5, for example, the so-called nail-head bonding method is adopted, in which the wire 5 is supplied through a capillary CP shown in FIG. 21 and is bonded by using ultrasonic wave and thermo-compression bonding together. In the present embodiment, the pad PD, the lead 4 and the wire connection region 10*wb* of the die pad 10 which are bonding objects are bonded while being heated in order to enhance the bonding strength.

A heat source which supplies heat to the pad PD, the lead 4 and the die pad 10 is, for example, a heater (heat source) HT incorporated in the heat stage HS. Specifically, by bringing the lower surface 10*b* of the die pad 10 into close contact with a die pad holding surface HSa of the heat stage HS, the die pad 10 and the pad PD of the semiconductor chip 3 are heated from the lower surface 10*b* side of the die pad 10. Also, by bringing the lower surface of the lead 4 into close contact with a lead holding surface HSb of the heat stage HS, the upper surface (surface to bond the wire 5*a*) of the lead 4 is heated from the lower surface side of the lead 4. In this way, by heating the pad PD, the lead 4 and the wire bonding region of the die pad 10 which are the members to be bonded, the bonding strength between the wire 5 and objects to be bonded can be enhanced.

Also, in the present embodiment, since the height of the central part 11 and the height of the peripheral edge part 12 differ as described above and the wire 5 is connected to the peripheral edge part 12 arranged at a relatively higher position, the heat stage HS has a peripheral edge part holding surface HSc arranged at a higher position than the die pad holding surface HSa as shown in FIG. 22. This peripheral edge part holding surface HSc is arranged at a position which is higher than the die pad holding surface HSa and lower than the lead holding surface HSb shown in FIG. 21, and is provided at the height capable of being in close contact with the lower surface 12*b* of the peripheral edge part 12 of the die pad 10.

In this way, by bringing the lower surface 12*b* of the peripheral edge part 12, in other words, the surface opposite to the wire connection region 10*wb* of the die pad 10 into close contact with a part of the heat stage HS, the wire connection region 10*wb* can be efficiently heated.

4. Sealing Process

Figure 23:
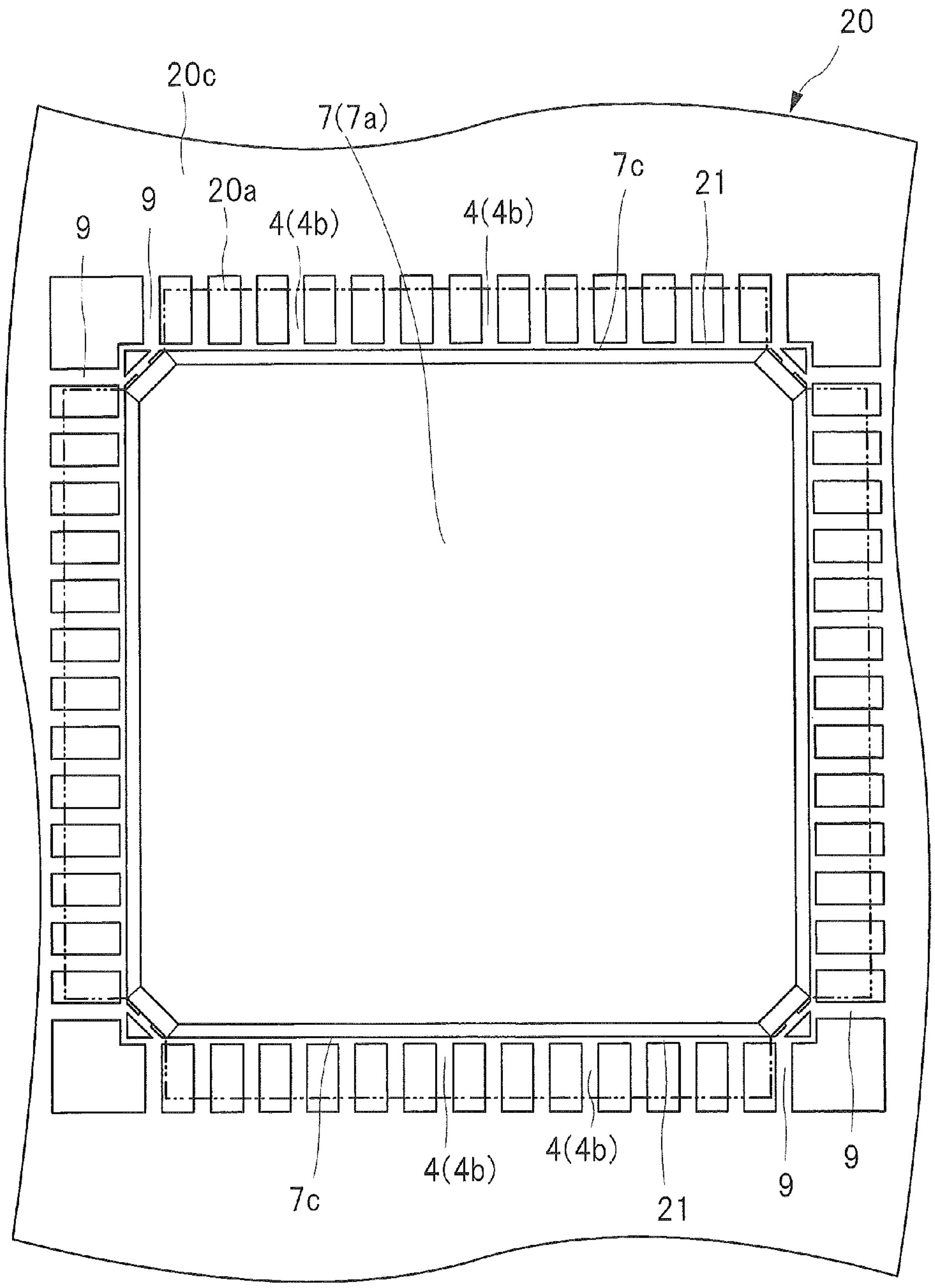
FIG. 23 is an enlarged plan view showing a state where the sealing body is formed in the product formation part of the lead frame shown in FIG. 20.
Figure 24:
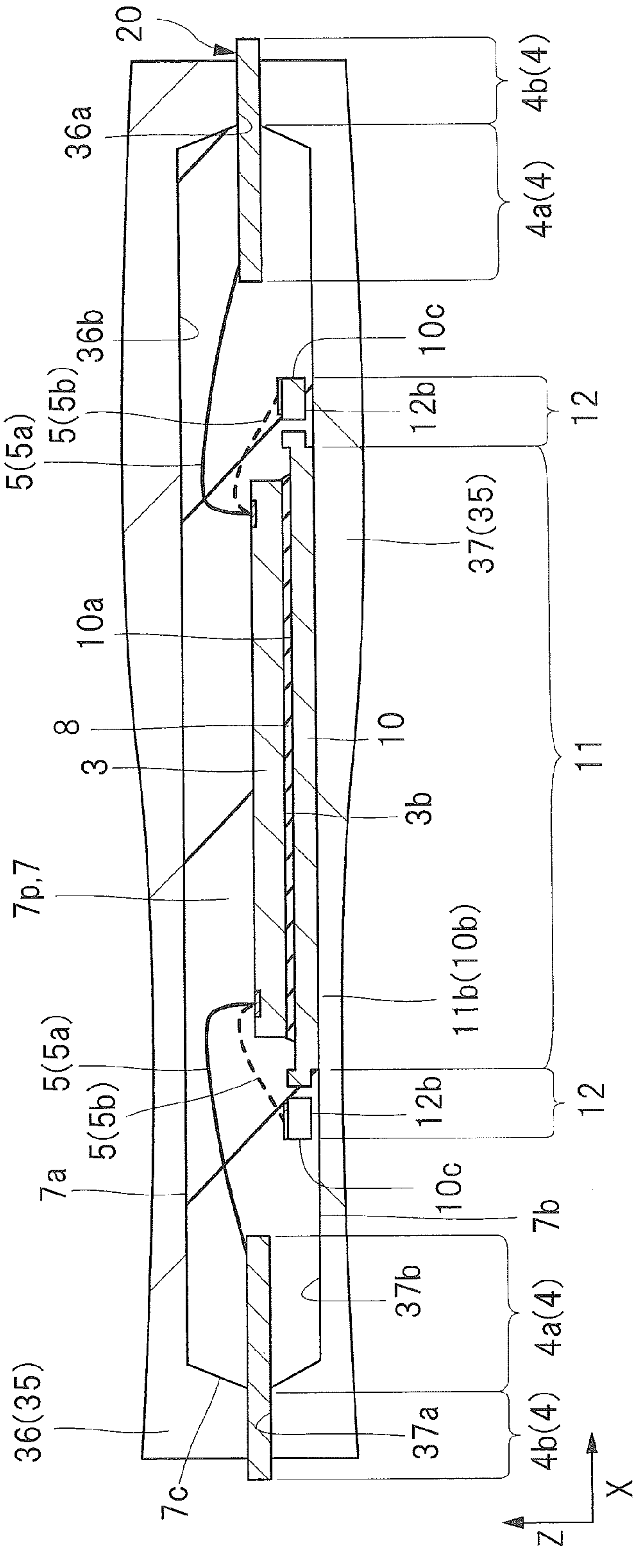
FIG. 24 is an enlarged sectional view showing a state where the sealing body is formed in the product formation part of the lead frame shown in FIG. 21.
Figure 25:
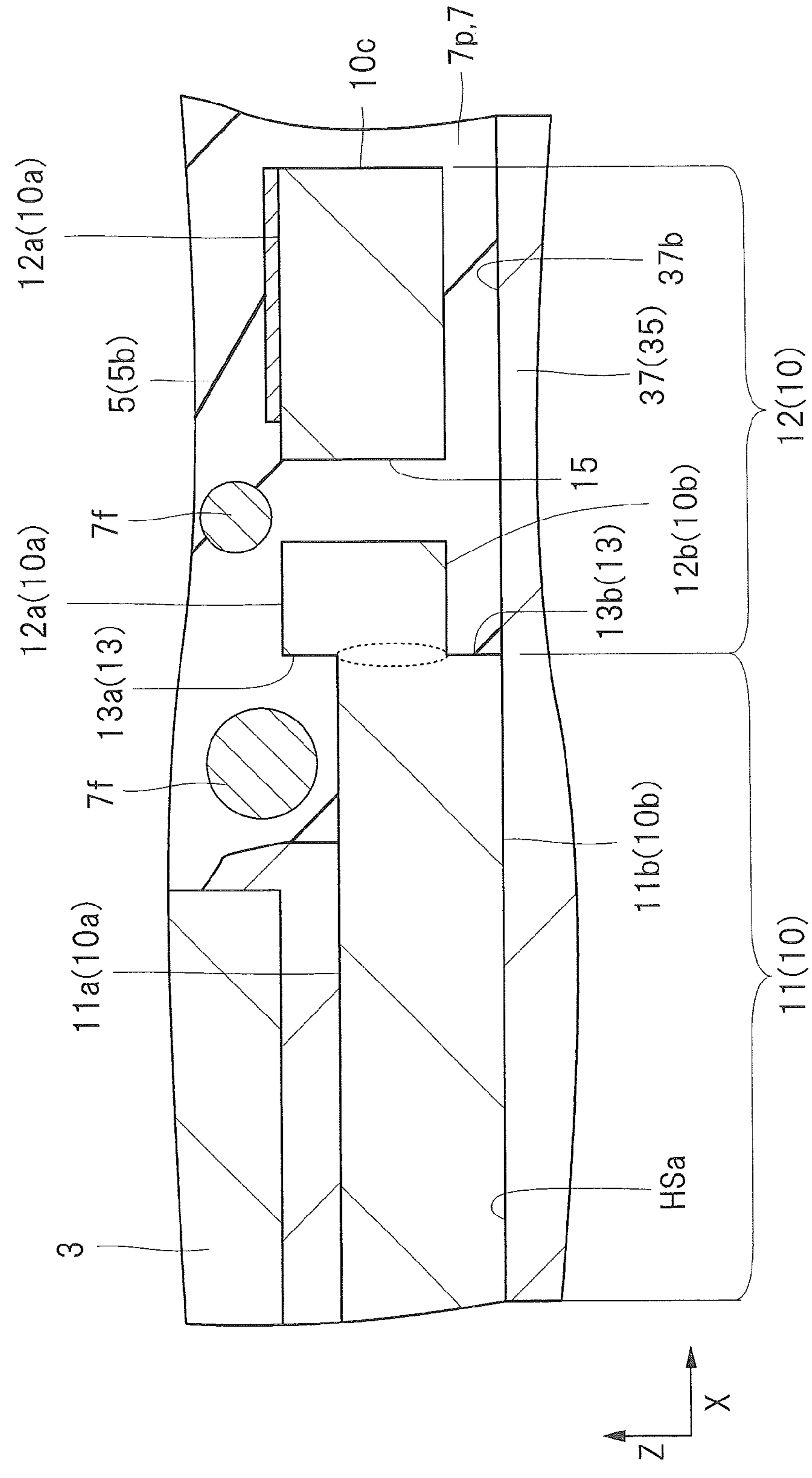
FIG. 25 is an explanatory diagram schematically showing a flow of sealing resin in a partially enlarged cross section of FIG. 24.

Next, as the sealing process (sealing body formation process) shown in FIG. 11, the semiconductor chip 3 (see FIG. 24), the plurality of wires 5 (see FIG. 24), the inner lead part 4*a* of the lead 4, and the upper surface 10*a* (see FIG. 24) of the die pad 10 (see FIG. 24) are sealed by forming the sealing body (resin body) 7 as shown in FIGS. 23 and 24. FIG. 23 is an enlarged plan view showing a state where the sealing body is formed in the product formation part of the lead frame shown in FIG. 20 and FIG. 24 is an enlarged sectional view showing a state where the sealing body is formed in the product formation part of the lead frame shown in FIG. 21. Also, FIG. 25 is an explanatory diagram schematically showing a flow of sealing resin in a partially enlarged cross section of FIG. 24.

In this process, first, as shown in FIG. 24, a molding die 35 which is provided with an upper die (first die) 36 having a die surface (first die surface) 36*a* and a cavity (recessed portion) 36*b* formed in this die surface 36*a* and a lower die (second die) 37 having a die surface (second die surface) 37*a* which is opposed to the die surface 36*a* of the upper die 36 and a cavity (recessed portion) 37*b* formed in this die surface 37*a* is prepared. Then, the lead frame 20 which has been subjected to the wire bonding process is placed inside the molding die 35 (between the upper die 36 and the lower dies 37) so that the semiconductor chip 3 and the die pad 10 are located in the cavity 36*b* of the upper die 36 and the cavity 37*b* of the lower die 37. Here, in the present embodiment, in order to expose the lower surface 10*b* of the die pad 10 on the lower surface 7*b* of the sealing body 7, the lower surface 10*b* is made to abut on the bottom surface of the cavity 37*b* of the lower die 37.

Next, the lead frame 20 is clamped with the upper die 36 and the lower die 37. At this time, when the lead frame 20 is clamped, a part of the plurality of leads 4 formed in the lead frame 20 is (at least a part overlapped with the tie bar 21 shown in FIG. 23) clamped. Then, a part of the lead 4 (inner lead part 4*a*) is arranged inside the cavities 36*b* and 37*b*, and the other part of the lead 4 (outer lead part 4*b*) is clamped by the molding die 35 outside the cavities 36*b* and 37*b*. Also, the cavity 37*b* is formed so as to have the depth (distance between the height of the die surface 37*a* and the height of the bottom surface of the cavity 37*b*) corresponding to an offset amount of the die pad 10 (so that the offset amount is equal to the depth of the cavity 37*b*). Therefore, when the lead frame 20 is clamped with the upper die 36 and the lower die 37, the lower surface 10*b* of the die pad 10 is brought into close contact with the bottom surface of the cavity 37*b* of the lower die 37.

Next, in the state where the lead frame 20 is clamped with the upper die 36 and the lower die 37, resin (for example, resin softened by heating) 7*p* (see FIG. 24) is supplied into the space formed by overlaying the cavity 36*b* of the upper die 36 on the cavity 37*b* of the lower die 37. Then, the semiconductor chip 3, the plurality of wires 5, a part of the plurality of leads 4 (inner lead parts 4*a*), and the upper surface 10*a* of the die pad 10 are sealed with this sealing resin 7*p*. Finally, the sealing body 7 is formed by thermally hardening the supplied resin 7*p*. The sealing method like this is referred to as the transfer-mold method.

In the transfer-mold method, the resin is supplied (injected) to the inside of the cavities 36*b* and 37*b* from a supply section (gate section), and the residual gas and surplus resin 7*p* inside the cavities 36*b* and 37*b* are discharged from a discharging section (vent section). When classifying the methods based on a position of the supply section with respect to the cavities 36*b* and 37*b*, the methods can be broadly classified into a top gate type in which the supply section is arranged on the upper side of the cavity 36*b* and a side gate type in which the supply section is arranged on the lateral side of the cavities 36*b* and 37*b*. In the present embodiment, the side gate type which is advantageous from a viewpoint of downsizing of the molding die or from a viewpoint of maintenance easiness of the molding die is adopted.

In the present embodiment, the sealing body 7 is formed so that a part of the lower surface 10*b* of the die pad 10, more specifically, the lower surface 11*b* of the central part 11 is exposed as shown in FIG. 24, but as described above, when the slit 15 is not provided and a width of the peripheral edge part 12 is large, it becomes difficult to supply the resin 7*p* so as to cover the whole lower surface 12*b* of the peripheral edge part 12. For example, in the example shown in FIG. 25, the width of the peripheral edge part 12 (length in the direction perpendicular to the extending direction) is larger than the thickness of the die pad 10 and is, for example, about twice as large as the thickness of the die pad 10.

As shown in FIG. 25, the space on the lower surface 12*b* side of the peripheral edge part 12 is surrounded by the lower surface 12*b* of the peripheral edge part 12, the step surface 13*b*, and the cavity 37*b* of the lower die 37. Therefore, when the resin 7*p* is supplied from the side surface 10*c* side, the residual gas in the space needs to be discharged from the supply port of the resin 7*p*. Also, since the pressure (static pressure) which acts in a counter direction of the supply pressure becomes larger as the width of the peripheral edge part 12 becomes larger, discharging of the residual gas becomes difficult, and the filling properties of the resin 7*p* are deteriorated.

Also, the resin 7*p* contains a number of filler particles 7*f* such as silica in order to make the linear expansion coefficient of the sealing body 7 close to the linear expansion coefficient of the semiconductor chip 3. Thus, when the filler particles 7*f* are caught between the lower surface 12*b* of peripheral edge part 12 and the cavity 37*b* of the lower die 37, the filler particles 7*f* may dam the flow of the resin 7*p*.

Therefore, in the present embodiment, in order to make it easy supply the resin to the lower surface 12*b* side of the peripheral edge part 12 having a large area, the slit 15 is provided between the wire connection region 10*wb* and the step surface 13*a*. For example, when the resin 7*p* is supplied from between the side surface 10*c* of die pad 10 and the lower die 37, the slit 15 functions as the vent section to discharge the residual gas or the like. Also, when the resin 7*p* is supplied from the slit 15, the opening part between the side surface 10*c* of die pad 10 and the lower die 37 functions as the vent section to discharge the residual gas or the like. In this way, the filling properties of the resin to the lower surface 12*b* side of the peripheral edge part 12 can be enhanced.

Also, the slit 15 is provided between the wire connection region 10*wb* and the central part 11, that is, at a position closer to the step surface 13*a* than the side surface 10*c*. Therefore, even when the filler particles 7*f* are caught between the lower surface 12*b* of peripheral edge part 12 and the cavity 37*b* of the lower die 37, since the static pressure which acts in a counter direction of the supply pressure of the resin 7*p* can be reduced, the filling properties of the resin to the lower surface 12*b* side of the peripheral edge part 12 can be further enhanced. In other words, in the present embodiment, since the slit 15 is provided between the wire connection region 10*wb* and the step surface 13*a*, the gap between the sealing body 7 and the die pad 10 which will be a cause of the entry of moisture can be reduced.

Next, by hardening the resin 7*p* supplied into the cavities 36*b* and 37*b*, the sealing body 7 shown in FIGS. 23 and 24 is acquired. When thermosetting resin such as an epoxy-based resin is used for the resin 7*p*, the resin can be hardened by performing heat treatment.

5. Exterior Plating Process

Figure 26:
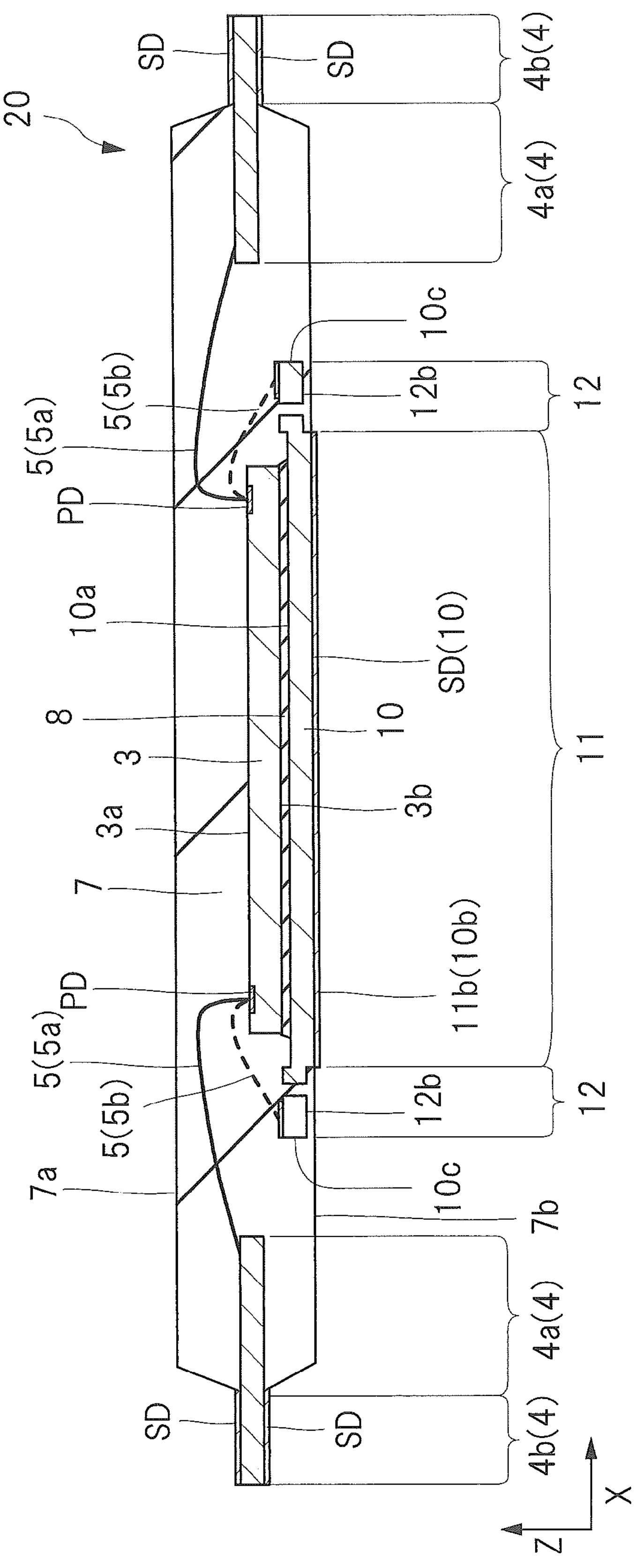
FIG. 26 is an enlarged sectional view showing a state where a metal film (exterior plating film, solder film) is formed on the exposed surfaces of the plurality of leads and the die pad which are exposed from the sealing body shown in FIG. 24.

Next, as the exterior plating process shown in FIG. 11, the metal film (exterior plating film, solder film) SD is formed on the exposed surface of the plurality of leads 4 (outer lead part 4*b*) exposed from the sealing body 7 as shown in FIG. 26. FIG. 26 is an enlarged sectional view showing a state where a metal film (exterior plating film, solder film) is formed on the exposed surfaces of the plurality of leads and the die pad which are exposed from the sealing body shown in FIG. 24.

In this process, the lead frame 20 which is an object to be plated is placed in a plating bath (not shown) containing plating liquid (not shown), and the metal film SD is formed by, for example, an electrolytic plating method. By this electrolytic plating method, the exterior plating film can be formed simultaneously on each region of the lead frame 20 exposed from the sealing body 7. Therefore, the metal film SD is formed so as to cover the exposed part of the die pad 10 (lower surface 11*b* of the central part 11) in addition to the exposed part of the lead 4. The metal film SD is formed also on the frame part 20*c* (see FIG. 23).

6. Lead Forming Process

Figure 27:
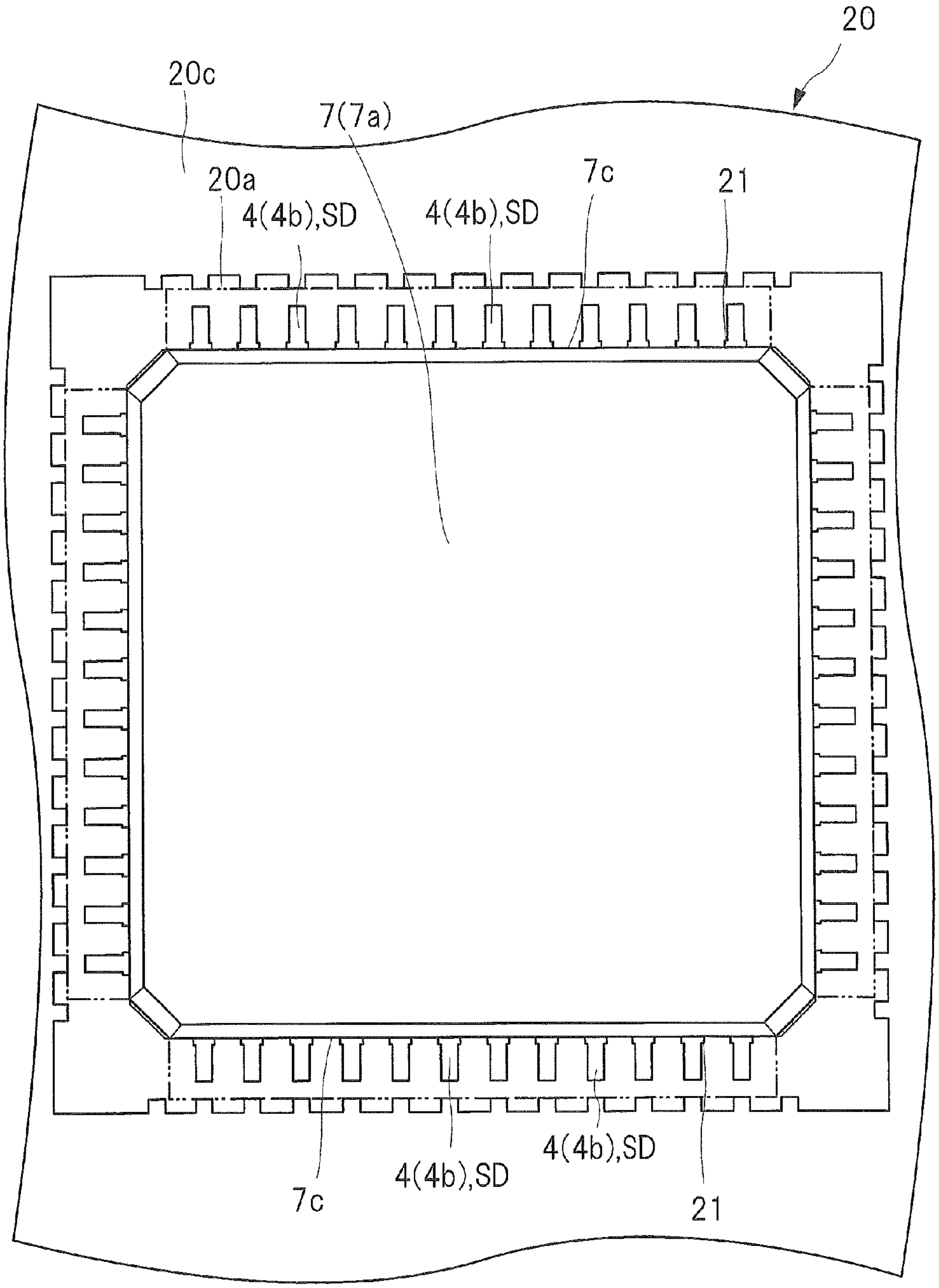
FIG. 27 is an enlarged plan view showing a state where the plurality of leads on which a metal film is formed in the exterior plating process shown in FIG. 11 are cut off from a frame part of the lead frame and then formed into proper shape.

Next, as the lead forming process, after connecting parts of the plurality of leads 4 connected to the frame part 20*c* of the lead frame 20 are cut off, the leads 4 are formed into proper shape by performing the bending process. FIG. 27 is an enlarged plan view showing a state where the plurality of leads on which a metal film is formed in the exterior plating process shown in FIG. 11 are cut off from a frame part of the lead frame and then formed into proper shape. Since a sectional view corresponding to FIG. 23 is the same as FIG. 4, the illustration thereof is omitted. Also, FIG. 27 shows a state where the dicing process shown in FIG. 11 is completed, and the suspension lead 9 shown in FIG. 23 is also cut off.

In this process, first, the plurality of leads 4 which are each connected and integrated with the frame part 20*c* are cut off at the connecting part, thereby forming them into individual members (lead cut process). Note that the tie bar 21 connecting the plurality of leads 4 is cut off between adjacent leads after the sealing process and before the exterior plating process (tie bar cut process). Although it is also possible to perform this tie bar cut process after the exterior plating process, the metal film SD is formed also on the cut surface when the tie bar 21 is cut off before the exterior plating process. Therefore, from a viewpoint of enhancing wettability of the solder at the time of mounting the semiconductor device 1 shown in FIG. 1, it is preferred to cut off the tie bar 21 before the exterior plating process.

In the tie bar cut process and the lead cut process, a die (support member (not shown)) and a punch (cutting blade (not shown)) are disposed on one surface (for example, lower surface) of the lead frame 20 and on the other surface (for example, upper surface) of the lead frame 20, respectively, and the leads 4 are cut off by pressing the lead frame 20. The edge part of the lead 4 cut off by the metal stamping in this way has the approximately flat cut surface, and the base material of the lead 4 is exposed from the metal film SD in the cut surface as shown in FIG. 4. By this process, the plurality of leads 4 become independent members each separated from each other.

Next, the plurality of cut off leads 4 are formed into proper shape by performing the bending process (bending process). In the present embodiment, for example, the outer lead part 4*b* is formed into the gull wing shape as shown in FIG. 4. Also, the process of further cutting the tip end of the lead 4 (outer lead part 4*b*) to adjust the length of the lead 4 may be performed as necessary.

7. Dicing Process

Next, as the dicing process shown in FIG. 11, as shown in FIG. 27, the plurality of suspension leads 9 (see FIG. 23) connected to the frame part 20*c* are cut off to dice the lead frame 20 into individual pieces for each product formation part 20*a*, thereby acquiring a plurality of semiconductor devices 1.

Although the dicing method is not particularly limited, a cutting method by metal stamping using a cutting die (not shown) is applicable in the same way as the above-mentioned lead cut process. After this process, necessary inspection and test such as a visual inspection and an electric test are performed, and successful ones will become the semiconductor device 1 as a finished product shown in FIGS. 1 to 9. Then, the semiconductor device 1 is shipped or mounted on the mounting board (not shown).

MODIFIED EXAMPLE

In the foregoing, the invention made by the inventors of the present invention has been concretely described based on the embodiments. However, it is needless to say that the present invention is not limited to the foregoing embodiments and various modifications and alterations can be made within the scope of the present invention.

For example, in the description of the above-mentioned embodiment, the semiconductor device 1 of a QFP type has been taken as an example of a semiconductor package in which the lower surface 10*b* of the die pad 10 is exposed, but the semiconductor package to which the present invention is applied is not limited to the QFP type. Although not shown, the present invention can be applied also to the semiconductor device of a QFN (Quad Flat Non-leaded package) type in which a part of a plurality of leads are exposed on the lower surface (mounting surface) of the sealing body 7.

Also, for example, in the above-mentioned embodiment, an embodiment where the step surface 13*a* is formed so as to continuously surround the circumference of the central part 11 has been described. When the wire connection region 10*wb* is provided in each of the four sides of the die pad 10 having a rectangular shape in a planar view like the die pad 10 shown in FIG. 6, it is preferred to continuously surround the circumference of the central part 11 with the step surface 13*a* from a viewpoint of suppressing the development of detachment to each of the plurality of wire connection regions 10*wb*. However, as a modified example, the wire connection region 10*wb* may be provided only in a part of the four sides (for example, one side) without providing the wire connection region 10*wb* in the other sides. In this case, if the step surface 13*a* is formed between the wire connection region 10*wb* and the central part 11 in the side where the wire connection region 10*wb* is formed, it is not always necessary to form the step surface 13*a* in the other sides.

Also, in the above-mentioned embodiment, for example, an embodiment where the dislocation process is performed while sandwiching the peripheral edge part 12 of the die pad 10 and the boundary with the central part 11 is shear-deformed, thereby forming the step surface 13*a* has been described. In this case, the step surface 13*b* is formed between the lower surface 12*b* of the peripheral edge part 12 and the lower surfaces 11*b* of the central part 11. However, from a viewpoint of suppressing the development of the detachment on the upper surface 11*a* side of the central part 11, it is not always necessary to form the step surface 13*b* on the lower surface 10*b* side of the die pad 10. For example, as a modified example with respect to the above-mentioned embodiment, an embodiment where the step surface 13*a* is formed on the upper surface 12*a* side of the peripheral edge part 12 and the step surface 13*b* is not formed on the lower surface 12*b* side of the peripheral edge part 12 can be applied. In this case, the lower surface 12*b* of the peripheral edge part 12 is located at the same height as the lower surface 11*b* of the central part 11. However, from a viewpoint of preventing the die pad 10 from falling off from the sealing body 7 and a viewpoint of suppressing the entry of moisture from the lower surface 10*b* side of the die pad 10, it is preferred that the lower surface 12*b* of the peripheral edge part 12 is arranged at a position higher than the lower surface 11*b* of the central part 11 and the lower surface 11*b* is covered with the sealing body 7 as described in the above-mentioned embodiment.

Also, although flatness of the surface of the die pad 10 is not particularly referred to in the above-mentioned embodiment, it is also possible to further enhance the adhesiveness between the die pad 10 and the sealing body 7 by performing the surface roughening process to the contact interface between the die pad 10 and the sealing body 7. More specifically, the surface roughness of the upper surface 11*a* of the central part 11 of the die pad 10 can be made larger (rougher) than the surface roughness of the lower surface 11*b*. However, since it is apprehended that connecting strength of the wire 5 is deteriorated when the surface roughening process is performed to the wire connection region 10*wb*, it is preferred that the surface roughening process is not performed to the upper surface 12*a* of the peripheral edge part 12 even when the surface roughening process is performed to the upper surface 11*a* of the central part 11. In other words, it is preferred that the surface roughness of the upper surface 11*a* is made larger (rougher) than the surface roughness of the upper surface 12*a*.

Also, in the above-mentioned embodiment, a method (post-plating method) in which the metal film made of solder (exterior plating film) SD is formed after the sealing body 7 is formed, thereby enhancing the wettability of the solder at the time of mounting on a mounting board (not shown) has been described, but the following modified examples are also applicable. That is, other than the post-plating method which has been described above as a technique for enhancing the wettability of the solder on a terminal surface of the semiconductor device, a so-called pre-plating method where a metal film is formed in advance on the surface of the lead frame has been known. The technique described in the above-mentioned embodiment can be applied also to the case of this pre-plating method.

When the pre-plating method is applied, for example, a surface metal film formation process in which a surface metal film which enhances the wettability of the solder is formed on the whole exposed surface of the lead frame is added after the step surface formation process or the offset process in the lead frame preparatory process shown in FIG. 11. In this surface metal film formation process, for example, the surface metal film made of nickel (Ni), palladium (Pd) or gold (Au) is formed by plating. In addition, when the pre-plating method is applied, the exterior plating process shown in FIG. 11 can be omitted. Therefore, in the case of the semiconductor device to which the pre-plating method is applied, the metal film SD made of solder as shown in FIG. 9 is not formed. Furthermore, in the case of the semiconductor device to which the pre-plating method is applied, for example, the surface metal film made of nickel (Ni), palladium (Pd) or gold (Au) is formed on the whole surface (upper surface and lower surface) of the die pad 10 and the lead 4.

Also, the configurations of the above-mentioned modified examples can be applied in combination.

What is claimed is:

1. A semiconductor device, comprising:

a die pad which has a first surface, a second surface located on an opposite side of the first surface, and a side of the first surface;

a lead arranged along the side of the first surface;

a semiconductor chip which has a front surface, a first electrode and a second electrode formed on the front surface, and a rear surface located on an opposite side of the front surface, and is mounted on a chip mounting region of the first surface of the die pad;

a first wire which electrically connects the first electrode of the semiconductor chip and the lead;

a second wire which electrically connects the second electrode of the semiconductor chip and the die pad; and a sealing body which seals the semiconductor chip, the fire wire and the second wire such that a part of the lead and the second surface of the die pad are exposed, wherein the die pad includes:

a first portion which has a third surface including the chip mounting region and facing a same direction as the first surface and a fourth surface located on an opposite side of the third surface;

a second portion which has a fifth surface facing the same direction as the first surface and a sixth surface located on an opposite side of the fifth surface and is provided so as to surround the first portion in a planar view; and a first step surface which is provided on the first surface between the third surface of the first portion and the fifth surface of the second portion and expands from the third surface to the fifth surface in a thickness direction of the first portion, the second wire is connected to a wire connection region provided on the fifth surface of the second portion, the fifth surface of the second portion is arranged at a position higher than the third surface of the first portion, and wherein, in a cross-sectional view, a distance from the first surface of the first portion to the second surface of the first portion is greater than a distance from the sixth surface of the second portion to an extended line along the second surface of the first portion in the thickness direction of first portion.

2. The semiconductor device according to claim 1, wherein the first step surface is formed so as to continuously surround a circumference of the third surface of the first portion.

3. The semiconductor device according to claim 2, wherein the sixth surface of the second portion is arranged at a position higher than the fourth surface of the first portion and is covered with the sealing body.

4. The semiconductor device according to claim 3, wherein a slit is formed between the wire connection region of the second portion and the first step surface so as to penetrate from one surface to the other surface of the fifth surface and the sixth surface.

5. The semiconductor device according to claim 4, wherein a width of the second portion is greater than a thickness of the die pad.

6. The semiconductor device according to claim 4, wherein a height of the first step surface is a half or less of a thickness of the die pad.

7. The semiconductor device according to claim 4, wherein a plurality of filler particles are contained in the sealing body.

8. The semiconductor device according to claim 1, wherein an angle which is formed between the first step surface and the third surface of the first portion is a right angle or an acute angle smaller than a right angle.

9. The semiconductor device according to claim 1, wherein, on the second surface of the die pad, a second step surface is provided between the fourth surface of the first portion and the sixth surface of the second portion, and the second step surface and the fifth surface of the second portion are covered with the sealing body.

10. The semiconductor device according to claim 1, wherein the first step surface comprises a shear surface formed by a shear deformation of a boundary between the first portion and the second portion.

11. A manufacturing method of a semiconductor device, comprising:

preparing a lead frame which includes a die pad having a first surface, a second surface located on an opposite side of the first surface, a side of the first surface, and a lead arranged along the side of the first surface;

mounting a semiconductor chip, which includes a front surface, a first electrode and a second electrode formed on the front surface, and a rear surface located on an opposite side of the front surface, on a chip mounting region of the first surface of the die pad;

after the mounting a semiconductor chip, electrically connecting the first electrode of the semiconductor chip to the lead via a first wire and electrically connecting the second electrode of the semiconductor chip and the die pad via the second wire;

after the electrically connecting, sealing the semiconductor chip, the first wire and the second wire with a resin such that a part of the lead and the second surface of the die pad are exposed, wherein the die pad of the lead frame prepared in the preparing a lead frame includes:

a first portion which has a third surface including the chip mounting region and facing a same direction as the first surface and a fourth surface located on an opposite side of the third surface;

a second portion which has a fifth surface facing the same direction as the first surface and located at a position higher than the third surface of the first portion and a sixth surface located on an opposite side of the fifth surface and is provided so as to surround the first portion in a planar view;

a first step surface which is provided on the first surface between the third surface of the first portion and the fifth surface of the second portion and expands from the third surface to the fifth surface in a thickness direction of the first portion, and wherein, in a cross-sectional view, a distance from the first surface of the first portion to the second surface of the first portion is greater than a distance from the sixth surface of the second portion to an extended line along the second surface of the first portion in the thickness direction of first portion; and in the electrically connecting, the second wire is connected to a wire connection region provided on the fifth surface of the second portion, and wherein the preparing a lead frame includes forming the first step surface by a shear deformation of a boundary between the first portion and the second portion of the die pad.

12. The manufacturing method of a semiconductor device according to claim 11, wherein the first step surface is formed so as to continuously surround a circumference of the third surface of the first portion.

13. The manufacturing method of a semiconductor device according to claim 12, wherein the sixth surface of the second portion is arranged at a position higher than the fourth surface of the first portion, and in the sealing the semiconductor chip , the sixth surface of the second portion is sealed so as to be covered with a resin.

14. The manufacturing method of a semiconductor device according to claim 13, wherein a slit is formed between the wire connection region of the second portion and the first step surface so as to penetrate from one surface to the other surface of the fifth surface and the sixth surface.

15. The manufacturing method of a semiconductor device according to claim 14, wherein, in the sealing the semiconductor chip , in a state where the lead frame is placed in a molding die, softened resin is injected and is then hardened.

16. The manufacturing method of a semiconductor device according to claim 15, wherein a width of the second portion is greater than a thickness of the die pad.

17. The manufacturing method of a semiconductor device according to claim 15, wherein a height of the first step surface is a half or less of a thickness of the die pad.

18. The manufacturing method of a semiconductor device according to claim 15, wherein, in the sealing the semiconductor chip , a plurality of filler particles are contained in the resin with which the semiconductor chip, the plurality of first wires and the second wires are sealed.

19. The manufacturing method of a semiconductor device according to claim 11, wherein an angle which is formed between the first step surface and the third surface of the first portion is a right angle or an acute angle smaller than a right angle.

20. The manufacturing method of a semiconductor device according to claim 11, wherein the preparing a lead frame includes forming the first step surface by a shear deformation of a boundary between the first portion and the second portion of the die pad.

* * * * *